US012603514B2

(12) United States Patent
Thiel et al.

(10) Patent No.: US 12,603,514 B2
(45) Date of Patent: **\*Apr. 14, 2026**

(54) SYSTEMS, METHODS, AND DEVICES FOR POWERING A MESH NETWORK USING A PORTABLE POWER CASE

(71) Applicant: LAT Enterprises, Inc., Raleigh, NC (US)

(72) Inventors: Laura Thiel, Raleigh, NC (US); Giancarlo Urzi, Raleigh, NC (US); Carlos Cid, Raleigh, NC (US)

(73) Assignee: LAT Enterprises, Inc., Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/298,792

(22) Filed: Aug. 13, 2025

(65) Prior Publication Data

US 2025/0374445 A1 Dec. 4, 2025

Related U.S. Application Data

(63) Continuation of application No. 19/185,885, filed on Apr. 22, 2025, now Pat. No. 12,483,049, which is a
(Continued)

(51) Int. Cl.
*H02J 7/00* (2026.01)
*H01Q 1/24* (2006.01)
(Continued)

(52) U.S. Cl.
CPC ............... *H02J 7/70* (2026.01); *H01Q 1/242* (2013.01); *H01Q 1/526* (2013.01); *H02J 7/82* (2026.01);
(Continued)

(58) Field of Classification Search
None
See application file for complete search history.

(56) References Cited

U.S. PATENT DOCUMENTS

| | | | |
|---|---|---|---|
| 1,901,232 | A | 3/1933 | Glowacki |
| RE21,577 | E | 9/1940 | Brownlee |

(Continued)

FOREIGN PATENT DOCUMENTS

| | | |
|---|---|---|
| JP | 2003174179 A | 6/2003 |
| JP | 2004103248 A | 4/2004 |

(Continued)

OTHER PUBLICATIONS

Machine translation of JP 2004-103248; accessed and printed Aug. 7, 2021 (Year: 2004).

*Primary Examiner* — Arun C Williams
(74) *Attorney, Agent, or Firm* — NEO IP

(57) ABSTRACT

Systems, methods, and articles for a portable power case are disclosed. The portable power case is comprised of at least one battery and at least one PCB. The portable power case is operable to supply power to a transceiver. The portable power case is operable to be charged using a DC power source (e.g., solar panel, wind turbine, water turbine). A plurality of portable power cases, DC power sources, and transceivers are operable to form a mesh network.

20 Claims, 16 Drawing Sheets

Related U.S. Application Data continuation of application No. 18/741,281, filed on Jun. 12, 2024, now Pat. No. 12,289,004, which is a continuation of application No. 18/408,141, filed on Jan. 9, 2024, now Pat. No. 12,015,292, which is a continuation of application No. 17/717,742, filed on Apr. 11, 2022, now Pat. No. 11,876,393, which is a continuation of application No. 16/685,547, filed on Nov. 15, 2019, now Pat. No. 11,309,723.

(60) Provisional application No. 62/768,661, filed on Nov. 16, 2018.

(51) Int. Cl.

| | |
|---|---|
| *H01Q 1/52* | (2006.01) |
| *H02J 7/70* | (2026.01) |
| *H02J 7/82* | (2026.01) |
| *H04B 1/3888* | (2015.01) |
| *H04W 4/029* | (2018.01) |
| *H05K 5/00* | (2006.01) |
| *H05K 5/02* | (2006.01) |
| *H02J 101/22* | (2026.01) |
| *H02J 101/28* | (2026.01) |
| *H02J 101/40* | (2026.01) |
| *H02J 105/44* | (2026.01) |

(52) U.S. Cl.

CPC .......... *H04B 1/3888* (2013.01); *H04W 4/029* (2018.02); *H05K 5/0086* (2013.01); *H05K 5/0217* (2013.01); *H02J 2101/22* (2026.01); *H02J 2101/28* (2026.01); *H02J 2101/40* (2026.01); *H02J 2105/44* (2026.01); *H02J 2207/40* (2020.01)

(56) References Cited

U.S. PATENT DOCUMENTS

| | | | |
|---|---|---|---|
| 2,450,369 | A | 9/1948 | Alexander |
| 2,501,725 | A | 3/1950 | Knopp |
| 3,968,348 | A | 7/1976 | Stanfield |
| 4,944,916 | A | 7/1990 | Franey |
| 4,969,206 | A | 11/1990 | Desrochers |
| 5,522,943 | A | 6/1996 | Spencer et al. |
| 5,621,299 | A | 4/1997 | Krall |
| 5,680,026 | A | 10/1997 | Lueschen |
| 7,494,348 | B1 | 2/2009 | Tyler et al. |
| 7,805,114 | B1 | 9/2010 | Quintana et al. |
| 8,415,924 | B2 | 4/2013 | Matthias et al. |
| 8,633,619 | B2 | 1/2014 | Robinson et al. |
| 8,638,011 | B2 | 1/2014 | Robinson et al. |
| 8,638,806 | B2 | 1/2014 | Wang et al. |
| 8,647,777 | B2 | 2/2014 | Yasunaga et al. |
| 8,775,846 | B2 | 7/2014 | Robinson et al. |
| 9,335,811 | B2 | 5/2016 | Long et al. |
| 9,634,485 | B2 | 4/2017 | Long et al. |
| 9,634,491 | B2 | 4/2017 | Robinson et al. |
| 9,640,965 | B1 | 5/2017 | Long et al. |
| 9,680,318 | B2 | 6/2017 | Carkner et al. |
| 9,756,549 | B2 | 9/2017 | Perdomo |
| 9,780,344 | B2 | 10/2017 | Thiel et al. |
| 9,911,965 | B2 | 3/2018 | Wacker |
| 9,992,021 | B1 | 6/2018 | Perdomo |
| 10,015,720 | B2 | 7/2018 | Perdomo |
| 10,063,069 | B1 | 8/2018 | Huff et al. |
| 10,069,329 | B1 | 9/2018 | Roberson |
| 10,250,134 | B2 | 4/2019 | Long et al. |
| 10,326,284 | B2 | 6/2019 | Long et al. |
| 10,333,315 | B2 | 6/2019 | Robinson et al. |
| 10,361,629 | B2 | 7/2019 | Long et al. |
| 10,461,289 | B2 | 10/2019 | Thiel et al. |
| 10,476,054 | B2 | 11/2019 | Thiel et al. |
| 10,531,590 | B2 | 1/2020 | Thiel et al. |
| 10,587,116 | B2 | 3/2020 | Long et al. |
| 10,594,142 | B2 | 3/2020 | Long et al. |
| 10,727,457 | B2 | 7/2020 | Thiel et al. |
| 10,848,067 | B2 | 11/2020 | Long et al. |
| 10,862,320 | B2 | 12/2020 | Carkner et al. |
| 10,873,191 | B2 | 12/2020 | Chien |
| 10,944,140 | B2 | 3/2021 | Thiel et al. |
| 10,991,992 | B2 | 4/2021 | Thiel et al. |
| 11,025,075 | B2 | 6/2021 | Thiel et al. |
| 11,025,076 | B2 | 6/2021 | Thiel et al. |
| 11,108,230 | B2 | 8/2021 | Long et al. |
| 11,201,483 | B2 | 12/2021 | Cross |
| 11,258,366 | B2 | 2/2022 | Long et al. |
| 11,283,265 | B2 | 3/2022 | Robinson et al. |
| 11,355,928 | B2 | 6/2022 | Long et al. |
| 11,569,667 | B2 | 1/2023 | Robinson et al. |
| 12,068,600 | B2 | 8/2024 | Long et al. |
| 2005/0275531 | A1* | 12/2005 | Johnson ............. G06K 7/10079 340/8.1 |
| 2006/0147172 | A1 | 7/2006 | Luther et al. |
| 2006/0267547 | A1 | 11/2006 | Godovich |
| 2007/0047100 | A1 | 3/2007 | Takahashi et al. |
| 2009/0004909 | A1 | 1/2009 | Puzio et al. |
| 2010/0008028 | A1 | 1/2010 | Richardson et al. |
| 2010/0224697 | A1 | 9/2010 | Modlin et al. |
| 2011/0059642 | A1 | 3/2011 | Slippy et al. |
| 2011/0064983 | A1 | 3/2011 | Yokoyama et al. |
| 2011/0100425 | A1 | 5/2011 | Osamura et al. |
| 2011/0290307 | A1 | 12/2011 | Workman et al. |
| 2012/0025766 | A1 | 2/2012 | Reade et al. |
| 2012/0043937 | A1 | 2/2012 | Williams |
| 2012/0094166 | A1 | 4/2012 | Lee et al. |
| 2012/0100414 | A1 | 4/2012 | Sonta |
| 2012/0313567 | A1 | 12/2012 | Ichikawa |
| 2013/0164567 | A1 | 6/2013 | Olsson et al. |
| 2013/0181666 | A1 | 7/2013 | Matthias et al. |
| 2013/0263922 | A1 | 10/2013 | Jung et al. |
| 2014/0072864 | A1 | 3/2014 | Suzuta et al. |
| 2014/0210399 | A1 | 7/2014 | Urschel et al. |
| 2014/0333412 | A1* | 11/2014 | Lewis ...................... G07C 9/22 340/5.2 |
| 2014/0361726 | A1 | 12/2014 | Carkner |
| 2015/0198670 | A1 | 7/2015 | Thiel |
| 2015/0295617 | A1 | 10/2015 | Lai et al. |
| 2017/0023851 | A1 | 1/2017 | Chien |
| 2017/0110896 | A1 | 4/2017 | Gissin et al. |
| 2017/0140637 | A1 | 5/2017 | Thurlow et al. |
| 2017/0229692 | A1 | 8/2017 | Thiel et al. |
| 2017/0264116 | A1 | 9/2017 | Carkner et al. |
| 2017/0269162 | A1 | 9/2017 | Thiel |
| 2018/0014241 | A1 | 1/2018 | Perdomo |
| 2018/0062197 | A1 | 3/2018 | Thiel et al. |
| 2018/0212445 | A1 | 7/2018 | Pitts et al. |
| 2018/0309307 | A1 | 10/2018 | Carkner |
| 2019/0133303 | A1 | 5/2019 | Thiel et al. |
| 2020/0059196 | A1 | 2/2020 | Thiel et al. |
| 2020/0266639 | A1 | 8/2020 | Thiel et al. |
| 2020/0313610 | A1 | 10/2020 | Thiel et al. |
| 2020/0343493 | A1 | 10/2020 | Thiel et al. |
| 2021/0280933 | A1 | 9/2021 | Thiel et al. |
| 2021/0313629 | A1 | 10/2021 | Thiel et al. |
| 2022/0231522 | A1 | 7/2022 | Thiel et al. |
| 2022/0231718 | A1 | 7/2022 | Stewart et al. |
| 2022/0285936 | A1 | 9/2022 | Long et al. |
| 2024/0146080 | A1 | 5/2024 | Thiel et al. |
| 2024/0372386 | A1 | 11/2024 | Thiel et al. |
| 2025/0253688 | A1 | 8/2025 | Thiel et al. |

FOREIGN PATENT DOCUMENTS

| | | | |
|---|---|---|---|
| KR | 101145898 | B1 | 5/2012 |
| KR | 101159750 | B1 | 6/2012 |
| KR | 101294972 | B1 | 8/2013 |
| WO | 2013106474 | A1 | 7/2013 |
| WO | 2015181673 | A1 | 12/2015 |

* cited by examiner

2530

SYSTEMS, METHODS, AND DEVICES FOR POWERING A MESH NETWORK USING A PORTABLE POWER CASE

CROSS REFERENCE TO RELATED APPLICATIONS

This application relates to and claims priority from the following applications. This application is a continuation of U.S. application Ser. No. 19/185,885, filed Apr. 22, 2025, which is a continuation of U.S. patent application Ser. No. 18/741,281, filed Jun. 12, 2024, which is a continuation of U.S. patent application Ser. No. 18/408,141, filed Jan. 9, 2024, which is a continuation of U.S. patent application Ser. No. 17/717,742, filed Apr. 11, 2022, which is a continuation of U.S. patent application Ser. No. 16/685,547, filed Nov. 15, 2019, which claims the benefit of U.S. Provisional Patent Application No. 62/768,661, filed Nov. 16, 2018. Each of the above listed applications is incorporated herein by reference in its entirety.

BACKGROUND OF THE INVENTION

1. Field of the Invention

The present invention relates generally to a portable power case including at least one battery that is operable to receive power from a direct current (DC) power source (e.g., solar panel, water turbine) and supply power to a transceiver. A plurality of portable power cases, DC power sources (e.g., solar panels, water turbines), and transceivers is operable to form a mesh network.

2. Description of the Prior Art

The military uses various types of portable electronic devices, such as portable battery-operated radios, which generate heat during operation, i.e., during normal operation, the devices may be heat-generating devices. In particular, a malfunctioning device can cause excessive heating. A drawback of heat-generating devices is that the heat may be transferred to the person using or carrying the device, causing uncomfortableness or burns. Another drawback of heat-generating devices is that the heat may be transferred to other devices, causing damage to these devices. Further, in military applications, heat-generating devices may increase the heat profile of military personnel, making them more prone to detection by thermal imaging and therefore more prone to danger.

It is known in the prior art to provide heat dissipating material or insulating material with heat-generating devices. It is also known in the prior art to provide a portable power supply for electronic devices, including military radios. Further, it is known in the prior art to provide mesh networks.

Representative prior art patent documents include the following:

U.S. Pat. No. 5,522,943 for portable power supply by inventors Spencer, et al., filed Dec. 5, 1994 and issued Jun. 4, 1996, is directed to a portable power supply that includes at least one solar panel assembly that is capable of producing an electrical output through the conversion of solar energy to electrical energy. The power supply further includes power transmission means which is typically an electrical cable that will supply the power output of the solar panel to an electrical energy consuming device such as a portable computer or a battery for use therewith. The portable power supply further includes a case having at least two opposing side panels and includes solar panel assembly attachment means permitting the mounting of a solar panel assembly. The solar panel assembly typically comprises a photovoltaic panel attached to a backing panel. Backing panels utilized in the solar panel assembly may also be foldable, thus protecting the attached photovoltaic panel within the folded sections of the backing panel.

U.S. Pat. No. 5,621,299 for rechargeable power supply with load voltage sensing, selectable output voltage and a wrist rest by inventor Krall, filed Nov. 14, 1994 and issued Apr. 15, 1997, is directed to a plurality of rechargeable batteries are provided as part of an electronic system that includes an electronic circuit which controls periodic charging of the batteries and allows selection of the output voltage over a given range. The system is preferably packaged in a shape to be easily integrated with a carrying case, such as a briefcase, and/or to physically match a specific type of portable equipment, such as a notebook computer. In one embodiment, the batteries and circuitry are included in a wrist rest structure of a type used with portable computer keyboards. In other forms, the power supply is useable with a large number of other specific items of portable electronic equipment, such as portable video and telecommunications equipment.

U.S. Patent Publication No. 20120025766 for charging apparatus and portable power supply by inventors Reade, et al., filed Jul. 27, 2011 and published Feb. 2, 2012, is directed to a portable battery box. The portable battery box is suitable for charging and housing a battery and includes a charging apparatus for charging a battery; a hollow lid shell and a hollow base shell for housing a rechargeable battery, the base hollow shell including a base wall, a top wall and at least one side wall extending between the base and top walls; and at least one handle disposed in a respective one of the side walls of the hollow base shell. Also described is a method for monitoring the charging of a battery in use disposed within a battery box, the method including the steps of: measuring first charging and/or discharging parameters at selected time intervals; estimating selected other charging parameters at selected time intervals; and displaying the first and other charging or discharging parameters on a display screen associated with the battery box, the charging or discharging parameters being selected from the group consisting of: battery voltage; charging cycle; time to charge completion; time to discharge completion; condition of the battery; battery charging current; battery discharging current.

U.S. Pat. No. 8,638,011 for portable power manager operating methods by inventors Robinson, et al., filed Jun. 15, 2010 and issued Jan. 28, 2014, is directed to various aspects providing portable power manager operating methods. One aspect provides a method for operating a power manager having a plurality of device ports for connecting with external power devices and a power bus for connecting with each device port. The method includes: disconnecting each device port from the power bus when no external power device is connected to the device port; accessing information from newly connected external power devices; determining if the newly connected external power devices can be connected to the power bus without power conversion; if not, determining if the newly connected external power devices can be connected to the power bus over an available power converter; and if so, configuring the available power converter for suitable power conversion.

U.S. Patent Publication No. 20170110896 for a portable case comprising a rechargeable power source by inventors Gissin, et al., filed May 18, 2015 and published Apr. 20, 2017, is directed to a portable case including a processor configured to control the portable case; a charging port; at least one output port; an adjustable energy storage system further including a battery printed circuit board (BPCB) including a plurality of battery packs connectors; and a central battery management microprocessor (CBMM); and a plurality of battery packs configured to be connected to the plurality of battery packs connectors and to provide power to electronic appliance connected to the at least one output port; a user interface configured to enable powering and monitoring of the portable case; and a recharging element, carryable by the portable case, the recharging element configured to be connected to the charging port and recharge at least one of the plurality of battery packs.

U.S. Pat. No. 9,992,021 for system and method for private and point-to-point communication between computing devices by inventor Perdomo, filed Mar. 14, 2014 and issued Jun. 5, 2018, is directed to a hardware and software bundle that can enable computers and mobile phones to communicate small data packages without relying on the internet or the central cellular network infrastructure. The bundle enables users to send text messages and other data. For example, GPS coordinates, multimedia from the situation, accelerometer and other sensor data can all be sent over a decentralized network, enabling enhanced communication and situation response when the central grid is unavailable.

U.S. Patent Publication No. 20180014241 for system and method for digital communication between computing devices by inventor Perdomo, filed Sep. 1, 2017 and published Jan. 11, 2018, is directed to a wireless communication device, comprising radio frequency transceivers which transmit outbound messages to targeted receivers, and receive the inbound messages addressed to the respective transceiver; each having a processor which controls the transceiver to establish communication sessions according to a protocol, and processes targeting and address information. The transceiver communicates with a telephone device having a telephone address book containing information which defines the targets and address for a telephone network and perhaps other networks. The address book entries are human editable through a human machine user interface. The address book entries are intended for centrally controlled switch networks having hierarchically formatted address information, but since these are at least quasi-unique, they are used as address labels in an unswitched peer-to-peer network formed of the transceivers. This permits a common address scheme across the peer-to-peer network and switched network of the telephone device.

SUMMARY OF THE INVENTION

The present invention relates generally to a portable power case including at least one battery that is operable to receive power from a DC power source (e.g., solar panel) and supply power to a transceiver. A plurality of portable power cases, DC power sources (e.g., solar panels), and transceivers is operable to form a mesh network.

In one embodiment, the present invention provides a system for powering a mesh network, including a plurality of portable power cases, a plurality of direct current (DC) power sources, and a plurality of transceivers, wherein each portable power case of the plurality of portable power cases includes a hard case, a printed circuit board (PCB), at least one battery removably connected to the PCB, wherein the hard case comprises a lid and a base that form a housing having an interior surface, an exterior surface, and an open interior space, wherein the at least one battery is rechargeable, wherein the at least one battery is removable from the hard case, wherein each portable power case is electrically connected to at least one DC power source of the plurality of DC power sources, wherein the at least one DC power source is operable to charge the at least one battery, wherein each portable power case is electrically connected to at least one transceiver of the plurality of transceivers, and wherein the plurality of transceivers is operable to form the mesh network.

In another embodiment, the present invention provides a system for powering a mesh network, including a plurality of portable power cases, a plurality of direct current (DC) power sources, and a plurality of transceivers, wherein each portable power case of the plurality of power cases includes a hard case, a printed circuit board (PCB), at least one battery removably connected to the PCB, wherein the hard case comprises a lid and a base that form a housing having an interior surface, an exterior surface, and an open interior space, wherein the hard case is waterproof to at least 4 meters, wherein the at least one battery is rechargeable, wherein the at least one battery is removable from the hard case, wherein each portable power case is electrically connected to at least one DC power source of the plurality of DC power sources, wherein the at least one DC power source is operable to charge the at least one battery, wherein each portable power case is electrically connected to at least one transceiver of the plurality of transceivers, and wherein the plurality of transceivers is operable to form the mesh network.

In yet another embodiment, the present invention provides a system for powering a mesh network, including a plurality of portable power cases, a plurality of direct current (DC) power sources, and a plurality of transceivers, wherein each portable power case of the plurality of portable power cases includes a hard case, a printed circuit board (PCB), at least one battery removably connected to the PCB, wherein the hard case comprises a lid and a base that form a housing having an interior surface, an exterior surface, and an open interior space, wherein the at least one battery is rechargeable, wherein the at least one battery is removable from the hard case, wherein each portable power case is electrically connected to at least one DC power source of the plurality of DC power sources, wherein the at least one DC power source is operable to charge the at least one battery, wherein each portable power case is electrically connected to at least one transceiver of the plurality of transceivers, wherein the plurality of transceivers is operable to form the mesh network, and wherein the PCB includes control electronics configured to determine a state of charge of the at least one battery.

These and other aspects of the present invention will become apparent to those skilled in the art after a reading of the following description of the preferred embodiment when considered with the drawings, as they support the claimed invention.

DETAILED DESCRIPTION

Figure 1:
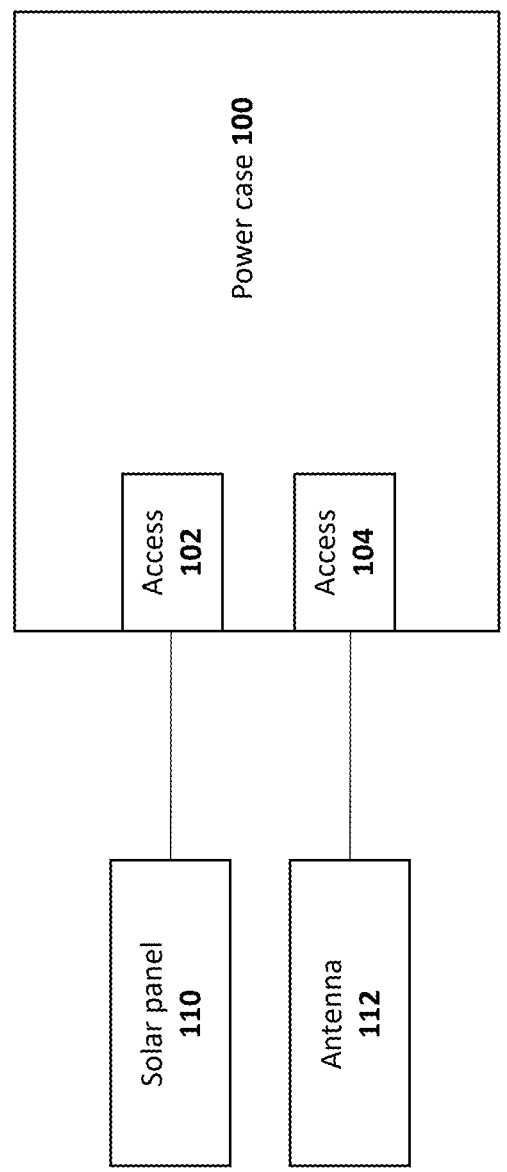
FIG. 1 illustrates a block diagram of a portable power case.

The present invention relates generally to a portable power case including at least one battery that is operable to receive power from a DC power source (e.g., solar panel) and supply power to a transceiver. A plurality of portable power cases, DC power sources (e.g., solar panels), and transceivers is operable to form a mesh network.

In one embodiment, the present invention provides a system for powering a mesh network, including a plurality of portable power cases, a plurality of direct current (DC) power sources, and a plurality of transceivers, wherein each portable power case of the plurality of portable power cases includes a hard case, a printed circuit board (PCB), at least one battery removably connected to the PCB, wherein the hard case comprises a lid and a base that form a housing having an interior surface, an exterior surface, and an open interior space, wherein the at least one battery is rechargeable, wherein the at least one battery is removable from the hard case, wherein each portable power case is electrically connected to at least one DC power source of the plurality of DC power sources, wherein the at least one DC power source is operable to charge the at least one battery, wherein each portable power case is electrically connected to at least one transceiver of the plurality of transceivers, and wherein the plurality of transceivers is operable to form the mesh network.

In another embodiment, the present invention provides a system for powering a mesh network, including a plurality of portable power cases, a plurality of direct current (DC) power sources, and a plurality of transceivers, wherein each portable power case of the plurality of power cases includes a hard case, a printed circuit board (PCB), at least one battery removably connected to the PCB, wherein the hard case comprises a lid and a base that form a housing having an interior surface, an exterior surface, and an open interior space, wherein the hard case is waterproof to at least 4 meters, wherein the at least one battery is rechargeable, wherein the at least one battery is removable from the hard case, wherein each portable power case is electrically connected to at least one DC power source of the plurality of DC power sources, wherein the at least one DC power source is operable to charge the at least one battery, wherein each portable power case is electrically connected to at least one transceiver of the plurality of transceivers, and wherein the plurality of transceivers is operable to form the mesh network.

In yet another embodiment, the present invention provides a system for powering a mesh network, including a plurality of portable power cases, a plurality of direct current (DC) power sources, and a plurality of transceivers, wherein each portable power case of the plurality of portable power cases includes a hard case, a printed circuit board (PCB), at least one battery removably connected to the PCB, wherein the hard case comprises a lid and a base that form a housing having an interior surface, an exterior surface, and an open interior space, wherein the at least one battery is rechargeable, wherein the at least one battery is removable from the hard case, wherein each portable power case is electrically connected to at least one DC power source of the plurality of DC power sources, wherein the at least one DC power source is operable to charge the at least one battery, wherein each portable power case is electrically connected to at least one transceiver of the plurality of transceivers, wherein the plurality of transceivers is operable to form the mesh network, and wherein the PCB includes control electronics configured to determine a state of charge of the at least one battery.

In other embodiments, the present invention provides systems, methods, and articles for a portable power case having a heat-shielding or blocking and/or heat-dissipating material layer or coating. The heat-shielding or blocking and/or heat-dissipating material is used to prevent and/or minimize heat transfer and the thermal effects produced from batteries, as well as to prevent and/or minimize heat transfer from external heat-producing articles or objects.

What is needed is a portable power case that includes at least one battery that is operable to receive power from a DC power source (e.g., solar panel, water turbine) and supply power to a transceiver. A plurality of portable power cases, DC power sources, and transceivers is operable to form a mesh network. There is a long-felt unmet need for a system to supply power to a transceiver using a portable power case without requiring user intervention to charge the portable power case. Advantageously, providing a DC power source (e.g., solar panel, water turbine) and a portable power case allows for the DC power source to charge the portable power case without requiring user intervention, thereby maintaining the mesh network without disruption for long periods of time (e.g., months, years), rather than hours.

Certain aspects of the presently disclosed subject matter of the invention, having been stated hereinabove, are addressed in whole or in part by the presently disclosed subject matter, and other aspects will become evident as the description proceeds when taken in connection with the accompanying illustrative examples and figures as best described herein below.

Referring now to the drawings in general, the illustrations are for the purpose of describing a preferred embodiment of the invention and are not intended to limit the invention thereto.

Portable Power Case

FIG. 1 illustrates a block diagram of one embodiment of a portable power case. The portable power case 100 is an example of equipment that is used for military and recreational purposes.

The portable power case has at least one access port or at least one lead accessibly positioned on an exterior surface of the hard case. The portable power case 100 in FIG. 1 has two access ports 102, 104. The portable power case 100 is operable to be charged using a solar panel 110 when connected to an access port (e.g., 102). The portable power case 100 is operable to supply power to a transceiver 112 when connected to an access port (e.g., 104).

In one embodiment, the portable power case includes at least one battery that is selectively removable from the portable power case. In a preferred embodiment, the at least one battery is in a housing for mating with a military radio (e.g., AN/PRC-117G, AN/PRC-117F). In one embodiment, the battery housing includes a latch operable to attach the battery to a military radio (e.g., AN/PRC-117G) with a corresponding catch. Alternatively, one or more of the at least one battery is a wearable battery. The batteries in the portable power case housing can be split apart amongst members of a team for transport to a location. This is advantageous in that it allows a large quantity of lithium ion batteries to arrive by air that otherwise could not be transported due to regulations. Team members can also use a single battery for a single military radio should rapid egress become necessary. This allows for maintaining communication even though the larger case and amplifier are abandoned. Further, the cables that attach to the outside of the portable power case are compatible with the batteries inside the portable power case, such that a second set of cables is not needed to power equipment if the batteries are removed from the portable power case. Additionally, if the portable power case is damaged in a combat related incident (e.g., damaged by an improvised explosive device or gunfire), the individual batteries could still work and provide power on their own.

The portable power case preferably includes a plurality of battery cells (i.e., batteries with their own casings) without a housing disposed within an open interior space of the hard case. In a preferred embodiment, the battery cells are electrochemical battery cells, and more preferably, include lithium ion rechargeable batteries. In one embodiment, the battery cells are lithium metal or lithium iron phosphate (LFP) cells. In an alternative embodiment, the battery cells are all-solid-state cells (e.g., using glass electrolytes and alkaline metal anodes), such as those disclosed in U.S. Publication Nos. 20180013170, 20180102569, 20180097257, 20180287150, 20180305216, 20180287222, 20180127280, 20160368777, and 20160365602, each of which is incorporated by reference herein in its entirety. In yet another embodiment, the battery cells are photo-accelerated lithium ion battery cells, such as those disclosed in Lee, A., Vörös, M., Dose, W. M. et al. Photo-accelerated fast charging of lithium-ion batteries. *Nat Commun* 10, 4946 (2019) doi:10.1038/s41467-019-12863-6, which is incorporated by reference herein in its entirety. In one embodiment, the battery cells are 18350, 14430, 14500, 18500, 16650, 18650, 21700, or 26650 cylindrical cells. The plurality of battery cells may be constructed and configured in parallel, series, or a combination. Preferably, the plurality of battery cells is removably disposed within the base or battery housing or container. For example, the plurality of battery cells can be replaced if they no longer hold a sufficient charge. Alternatively, the plurality of battery cells is sealed within the portable power case.

Advantageously, not including a housing for the plurality of battery cells reduces the weight and dimensions of the portable power case 100. Soldiers often carry 60-100 lbs. of gear in their rucksack or attached to their vest. Additional weight slows soldiers down and also makes it more likely that they will suffer injuries to their body (e.g., injuries to the back, shoulders, hips, knees, ankles, and feet). Advantageously, including a plurality of battery cells without a housing allows the portable power case to be sized to fit in a rucksack. Additionally, including a plurality of battery cells without a housing allows the portable power case to be easily installed (e.g., in trees, on poles), disassembled, transported to a new location, and reinstalled due to the reduction in weight and dimensions. In one embodiment, the plurality of battery cells is sealed within the portable power case to prevent a user from tampering with the plurality of battery cells. In another embodiment, the plurality of battery cells is sealed in flashspun high-density polyethylene (e.g., DuPont™ Tyvek®), heat shrink tubing, or polyimide film (e.g., DuPont™ Kapton®).

The plurality of battery cells is preferably connected to the leads via a battery management system. The battery management system (BMS) protects the plurality of battery cells from operating outside of a safe operating area by including at least one safety cutoff. The at least one safety cutoff relates to voltage, temperature, state of charge, state of health, and/or current. In a preferred embodiment, the at least one safety cutoff is passively monitored (i.e., not monitored continuously). In one embodiment, the BMS does not include a processor. In another embodiment, the BMS calculates a charge current limit, a discharge current limit, an energy delivered since last charge, a charge delivered, a charge stored, a total energy delivered since first use, a total operating time since first use, and/or a total number of cycles.

In another embodiment, the plurality of battery cells is connected to a printed circuit board (PCB). In one embodiment, the plurality of battery cells is removably connected to the PCB by a harness. The harness consists of cables with connectors that allow the plurality of battery cells to easily connect to the PCB by simply pushing a connector into a corresponding battery. The harness reduces the complexity of electrically connecting the batteries and the PCB. In one embodiment, the harness uses slip away connectors based on a Fischer® SOV 105 A087 connector. In another embodiment, the harness uses at least one friction fit connector. Alternatively, the harness uses at least one locking connector. In still another embodiment, the plurality of battery cells is hard-wired to the PCB.

Figure 2A:
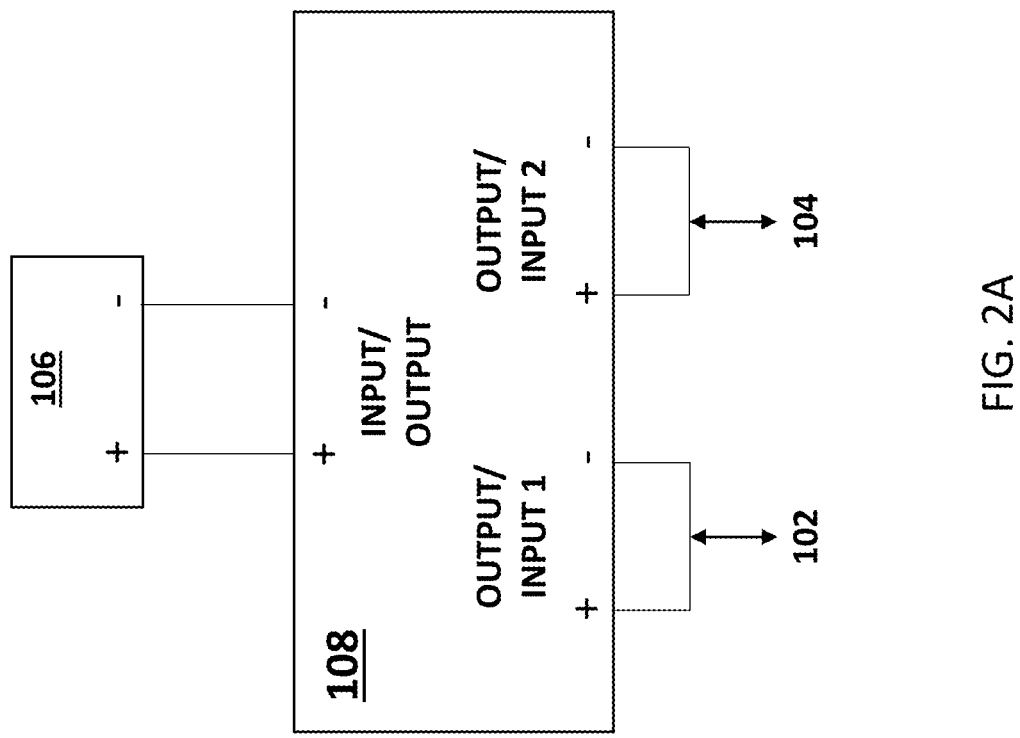
FIG. 2A illustrates a block diagram of the connections to a battery management system (BMS).

FIG. 2A illustrates a block diagram of the connections to a BMS in a preferred embodiment. The BMS 108 is connected to the plurality of battery cells 106 at INPUT/OUTPUT. The BMS 108 is electrically connected to two OUTPUT/INPUT ports. INPUT/OUTPUT 1 is connected to access port 102 and INPUT/OUTPUT 2 connected to access port 104. Each access port 102, 104 can be used to charge the plurality of battery cells 106 and supply power to at least one power consuming device. In a preferred embodiment, access ports 102, 104 have the same output voltage.

Therefore, each access port and/or lead is preferably operable to charge and discharge at the same time. In one example, a Y-splitter with a first connector and a second connector is attached to a lead. The Y-splitter allows the lead to supply power to equipment via the first connector and charge a battery via the second connector at the same time. In another example, a Y-splitter with a first connector and a second connector is attached to an access port. The Y-splitter allows the access port to supply power to equipment via the first connector and charge a battery via the second connector at the same time. Thus, each access port and/or lead is operable to allow power to flow in and out of the portable power case simultaneously. Alternatively, an access port is configured for the charging function or the discharging function only.

Figure 2B:
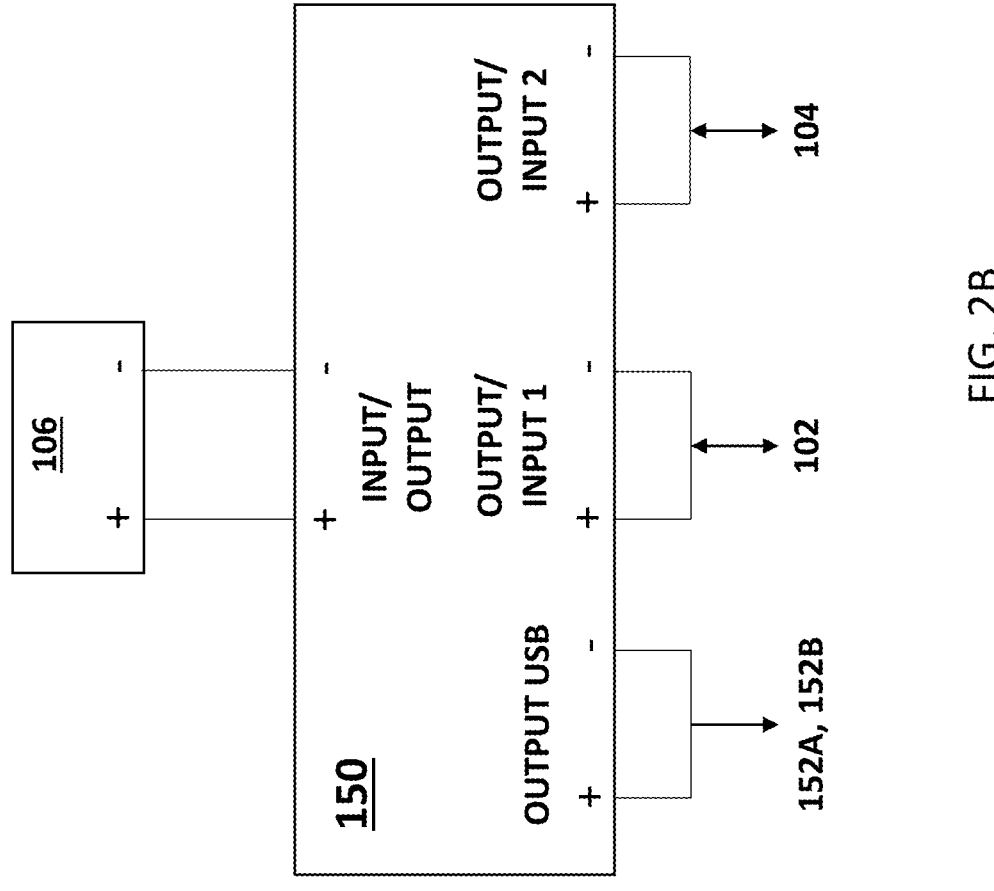
FIG. 2B illustrates a block diagram of the connections to a printed circuit board (PCB).

FIG. 2B illustrates a block diagram of the connections to a PCB in a preferred embodiment. The PCB 150 is connected to the plurality of battery cells 106 at INPUT/OUTPUT. The PCB 150 is electrically connected to two OUTPUT/INPUT ports and an output universal serial bus (USB) port. INPUT/OUTPUT 1 is connected to access port 102 and INPUT/OUTPUT 2 connected to access port 104. Each access port 102, 104 can be used to charge the plurality of battery cells 106 and supply power to at least one power consuming device. OUTPUT USB is connected to USB ports 152A, 152B.

In a preferred embodiment, the at least two access ports (e.g., access ports 102 and 104) have the same output voltage. In an alternative embodiment, the at least two access ports (e.g., access ports 102 and 104) include at least two different output voltages. The PCB includes at least one voltage converter for achieving the at least two different output voltages. In one example, a first access port has an output voltage equivalent to the input voltage of the plurality of battery cells (e.g., 29.4V) and a second access port has a lower output voltage (e.g., 16.8V). The PCB includes a voltage converter to convert the input voltage of the plurality of battery cells to the lower output voltage of the second access port.

In a preferred embodiment, the at least two access ports, at least two leads, or at least one access port and the at least one lead are the same type of connector (e.g., female Fischer® SOV 105 A087 connectors, Tajimi™ Electronics part number R04-P5f, Tajimi™ Electronics part number TR05 R5f) and provide the same output voltage. Alternatively, the at least two access ports, at least two leads, or at least one access port and the at least one lead are made of at least two different types of connectors and/or provide different output voltages. Preferably, the diameter and/or shape of the connector is different for different input voltages. In one example, an access port or lead has a higher output voltage (e.g., 29.4V) and larger diameter, while another access port or lead has a lower output voltage (e.g., 16.8V) and smaller diameter. This coordination of higher voltage with larger diameter and lower voltage with smaller diameter makes it intuitive for an operator to use the correct access port or lead for the correct device (e.g., amplifier, radio, wearable battery, vehicle battery, AC adapter, generator, solar panel, laser designator, drone battery). Advantageously, this coordination allows an operator to associate the correct access port or lead with the correct device in the dark. Thus, the access port or lead is an inherent voltage selector. Further, the operator can quickly connect devices without knowing an operating voltage, thereby maintaining situational awareness and eyes on combat. Additionally, this coordination allows untrained operators to easily install the device in emergency situations (e.g., natural disasters, terrorist attacks).

The PCB does not use ferrite beads to reduce noise in one embodiment. In a first trial, ferrite beads were installed and the connectors failed. In a second trial, two ferrite beads were installed in parallel and the connectors failed. The connectors worked after the ferrite beads were removed. The ferrite beads did not have sufficient current capability. The PCB uses capacitors to protect the batteries in another embodiment.

In one embodiment, the PCB includes at least one processor. By way of example, and not limitation, the processor may be a general-purpose microprocessor (e.g., a central processing unit (CPU)), a graphics processing unit (GPU), a microcontroller, a Digital Signal Processor (DSP), an Application Specific Integrated Circuit (ASIC), a Field Programmable Gate Array (FPGA), a Programmable Logic Device (PLD), a controller, a state machine, gated or transistor logic, discrete hardware components, or any other suitable entity or combinations thereof that can perform calculations, process instructions for execution, and/or other manipulations of information.

One or more of the at least one processor is incorporated into control electronics used to determine the state of charge (SOC) of the portable power case in one embodiment. Examples of state of charge indicators are disclosed in U.S. Publication Nos. 20170269162 and 20150198670, each of which is incorporated herein by reference in its entirety.

Figure 3:
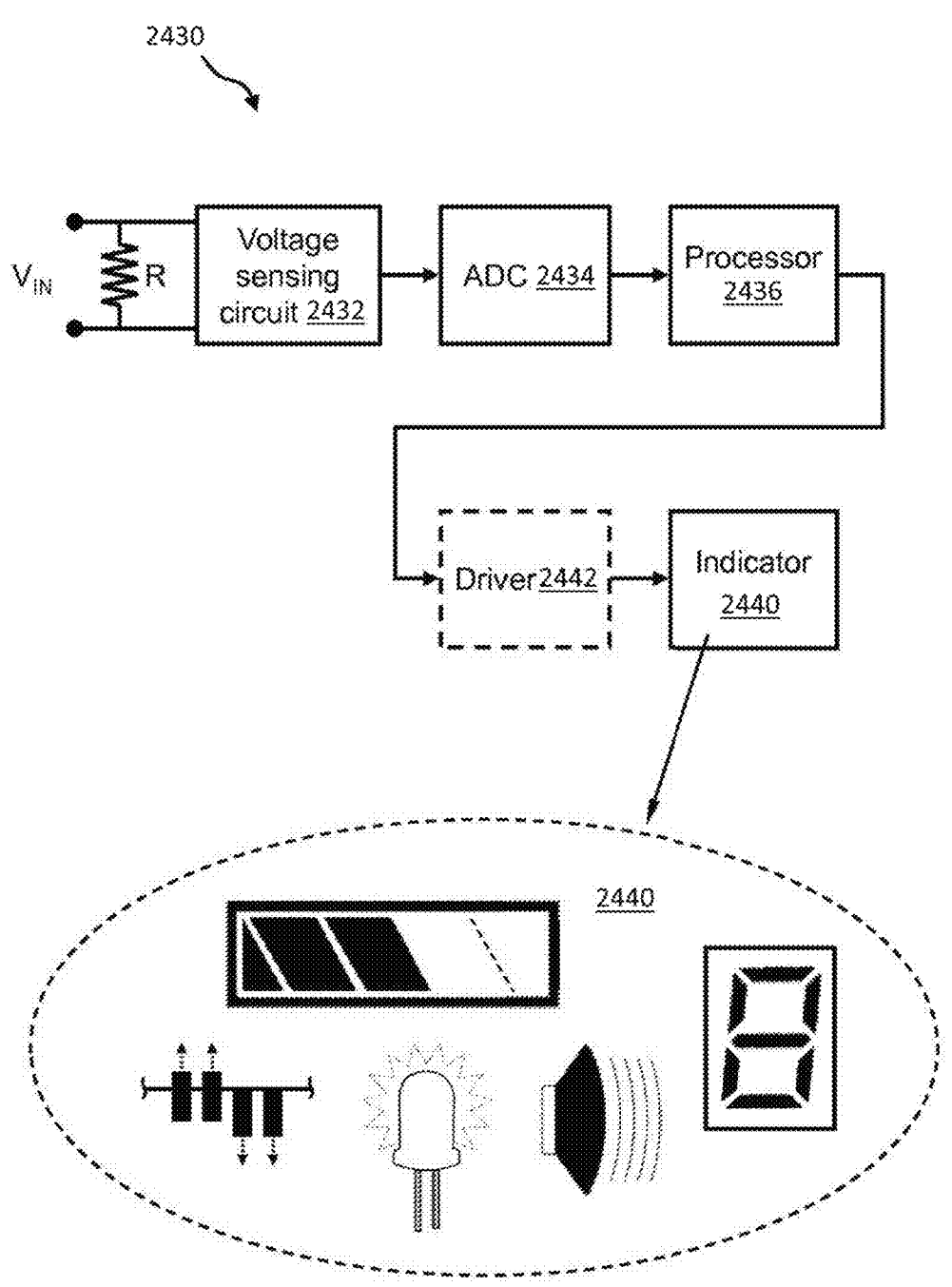
FIG. 3 illustrates a block diagram of one embodiment of the control electronics for a state of charge (SOC) indicator incorporated into the portable power case.

FIG. 3 illustrates a block diagram of one embodiment of the control electronics for a state of charge indicator incorporated into the portable power case. In this example, the control electronics 2430 includes a voltage sensing circuit 2432, an analog-to-digital converter (ADC) 2434, a processor 2436, the indicator 2440, and optionally a driver 2442.

The voltage sensing circuit 2432 can be any standard voltage sensing circuit, such as those found in volt meters. An input voltage $V_{IN}$ is supplied via the power BUS. In one embodiment, the voltage sensing circuit 2432 is designed to sense any direct current (DC) voltage in the range of from about 0 volts DC to about 50 volts DC. In one embodiment, the voltage sensing circuit 2432 includes standard amplification or de-amplification functions for generating an analog voltage that correlates to the amplitude of the input voltage $V_{IN}$ that is present. The ADC 2434 receives the analog voltage from the voltage sensing circuit 2432 and performs a standard analog-to-digital conversion.

The processor 2436 manages the overall operations of the SOC indicator. The processor 2436 is any controller, microcontroller, or microprocessor that is capable of processing program instructions.

The indicator 2440 is any visual, audible, or tactile mechanism for indicating the state of charge of the portable power case. A preferred embodiment of a visual indicator is at least one 5-bar liquid crystal display (LCD), wherein five bars flashing or five bars indicates greatest charge and one bar or one bar flashing indicates least charge. Another example of a visual indicator is at least one seven-segment numeric LCD, wherein the number 5 flashing or the number 5 indicates greatest charge and the number 1 or the number 1 flashing indicates least charge. Alternatively, the at least one LCD displays the voltage of the portable power case as measured by the control electronics.

The at least one LCD is preferably covered with a transparent material. In a preferred embodiment, the cover is formed of a clear plastic (e.g., poly(methyl methacrylate)). This provides an extra layer of protection for the at least one LCD, much like a screen protector provides an extra layer of protection for a smartphone. This increases the durability of the at least one LCD. The portable power case includes a waterproof sealant (e.g., silicone) around the cover.

Alternatively, a visual indicator is at least one LED. One preferred embodiment of a visual indicator is a set of light-emitting diodes (LEDs) (e.g., 5 LEDs), wherein five lit LEDs flashing or five lit LEDs indicates greatest charge and one lit LED or one lit LED flashing indicates least charge. In one embodiment, the LEDs are red, yellow, and/or green. In one example, two of the LEDs are green to indicate a mostly full charge on the portable power case, two of the LEDs are yellow to indicate that charging will soon be required for the portable power case, and one LED is red to indicate that the portable power case is almost drained. In a preferred embodiment, at least three bars, lights, or numbers are used to indicate the state of charge.

In one embodiment, the at least one LED is preferably covered with a transparent material. In a preferred embodiment, the cover is formed of a clear plastic (e.g., poly(methyl methacrylate)). This provides an extra layer of protection for the at least one LED. This increases the durability of the at least one LED. The portable power case includes a waterproof sealant (e.g., silicone) around the cover.

One example of an audible indicator is any sounds via an audio speaker, such as beeping sounds, wherein five beeps indicates greatest charge and one beep indicates least charge. Another example of an audible indicator is vibration sounds via any vibration mechanism (e.g., vibration motor used in mobile phones), wherein five vibration sounds indicates greatest charge and one vibration sound indicates least charge.

One example of a tactile indicator is any vibration mechanism (e.g., vibration motor used in mobile phones), wherein five vibrations indicate greatest charge and one vibration indicate least charge. Another example of a tactile indicator is a set of pins that rise up and down to be felt in Braille-like fashion, wherein five raised pins indicates greatest charge and one raised pin indicates least charge.

In one example, the processor 2436 is able to drive indicator 2440 directly. In one embodiment, the processor 2436 is able to drive directly a 5-bar LCD or a seven-segment numeric LCD. In another example, however, the processor 2436 is not able to drive indicator 2440 directly. In this case, the driver 2442 is provided, wherein the driver 2442 is specific to the type of indicator 2440 used in the control electronics 2430.

Additionally, the processor 2436 includes internal programmable functions for programming the expected range of the input voltage $V_{IN}$ and the correlation of the value the input voltage $V_{IN}$ to what is indicated at the indicator 2440. In other words, the discharge curve of the portable power case can be correlated to what is indicated at indicator 2440. In one embodiment, the processor 2436 is programmed based on a percent discharged or on an absolute value present at the input voltage $V_{IN}$.

In one embodiment, the PCB includes at least one antenna or at least one transceiver, which allows the portable power case to send information (e.g., state of charge information) to at least one remote device (e.g., smartphone, tablet, laptop computer, satellite phone, augmented reality viewer, enhanced clip-on SWIR imager (E-COSI)) and/or receive information (e.g., software updates, activation of kill switch) from at least one remote device. The at least one antenna or at least one transceiver provides wireless communication, standards-based or non-standards-based, by way of example and not limitation, radiofrequency (RF), Bluetooth®, Zig- Bee®, Wi-Fi®, Near Field Communication (NFC), a Link 16 network, a mobile ad hoc network (MANET), a mesh network (Meshnet), or similar standards used by a military or commercial entity. In one embodiment, the wireless communications are encrypted. In another embodiment, the antenna or the transceiver provides communications over the Secret Internet Protocol Router Network (SIPRNet).

Figure 4A:
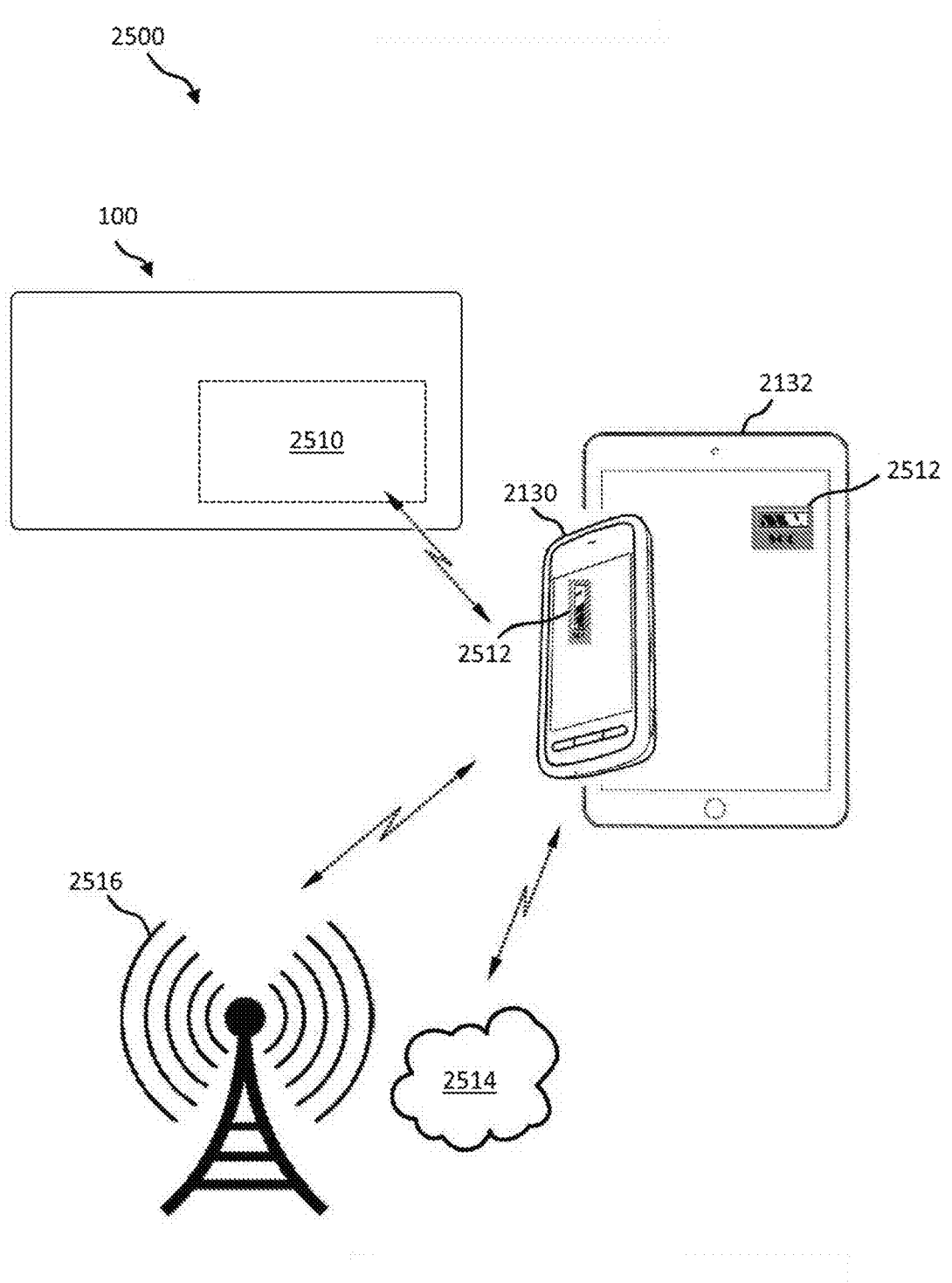
FIG. 4A illustrates a block diagram of an example of an SOC system that includes a mobile application for use with a portable power case.

FIG. 4A illustrates a block diagram of an example of an SOC system 2520 that includes a mobile application for use with a portable power case. The SOC system 2520 includes a portable power case 2100 having a communications interface 2510.

The communications interface 2510 is any wired and/or wireless communication interface for connecting to a network and by which information may be exchanged with other devices connected to the network. Examples of wired communication interfaces include, but are not limited to, USB ports, RS232 connectors, RJ45 connectors, Ethernet, and any combinations thereof. Examples of wireless communication interfaces include, but are not limited to, an Intranet connection, Internet, ISM, Bluetooth® technology, Wi-Fi®, WiMAX®, IEEE 802.11 technology, radio frequency (RF), Near Field Communication (NFC), ZigBee®, Infrared Data Association (IrDA) compatible protocols, Local Area Networks (LAN), Wide Area Networks (WAN), Shared Wireless Access Protocol (SWAP), any combinations thereof, and other types of wireless networking protocols.

The communications interface 2510 is used to communicate, preferably wirelessly, with at least one remote device, such as but not limited to, a mobile phone 2130 or a tablet 2132. The mobile phone 2130 can be any mobile phone that (1) is capable of running mobile applications and (2) is capable of communicating with the portable power case. The mobile phone 2130 can be, for example, an Android™ phone, an Apple® iPhone®, or a Samsung® Galaxy® phone. Likewise, the tablet 2132 can be any tablet that (1) is capable of running mobile applications and (2) is capable of communicating with the portable power case. The tablet 2132 can be, for example, the 3G or 4G version of the Apple® iPad®.

Further, in SOC system 2500, the mobile phone 2130 and/or the tablet 2132 is in communication with a cellular network 2516 and/or a network 2514. The network 2514 can be any network for providing wired or wireless connection to the Internet, such as a local area network (LAN), a wide area network (WAN), a mobile ad hoc network (MANET), a mesh network (Meshnet), SIPRNet, a Link 16 network, or other military or commercial network.

An SOC mobile application 2512 is installed and running at the mobile phone 2130 and/or the tablet 2132. The SOC mobile application 2512 is implemented according to the type (i.e., the operating system) of mobile phone 2130 and/or tablet 2132 on which it is running. The SOC mobile application 2512 is designed to receive SOC information from the portable power case. The SOC mobile application 2512 indicates graphically, audibly, and/or tactilely, the state of charge to the user (not shown).

Figure 4B:
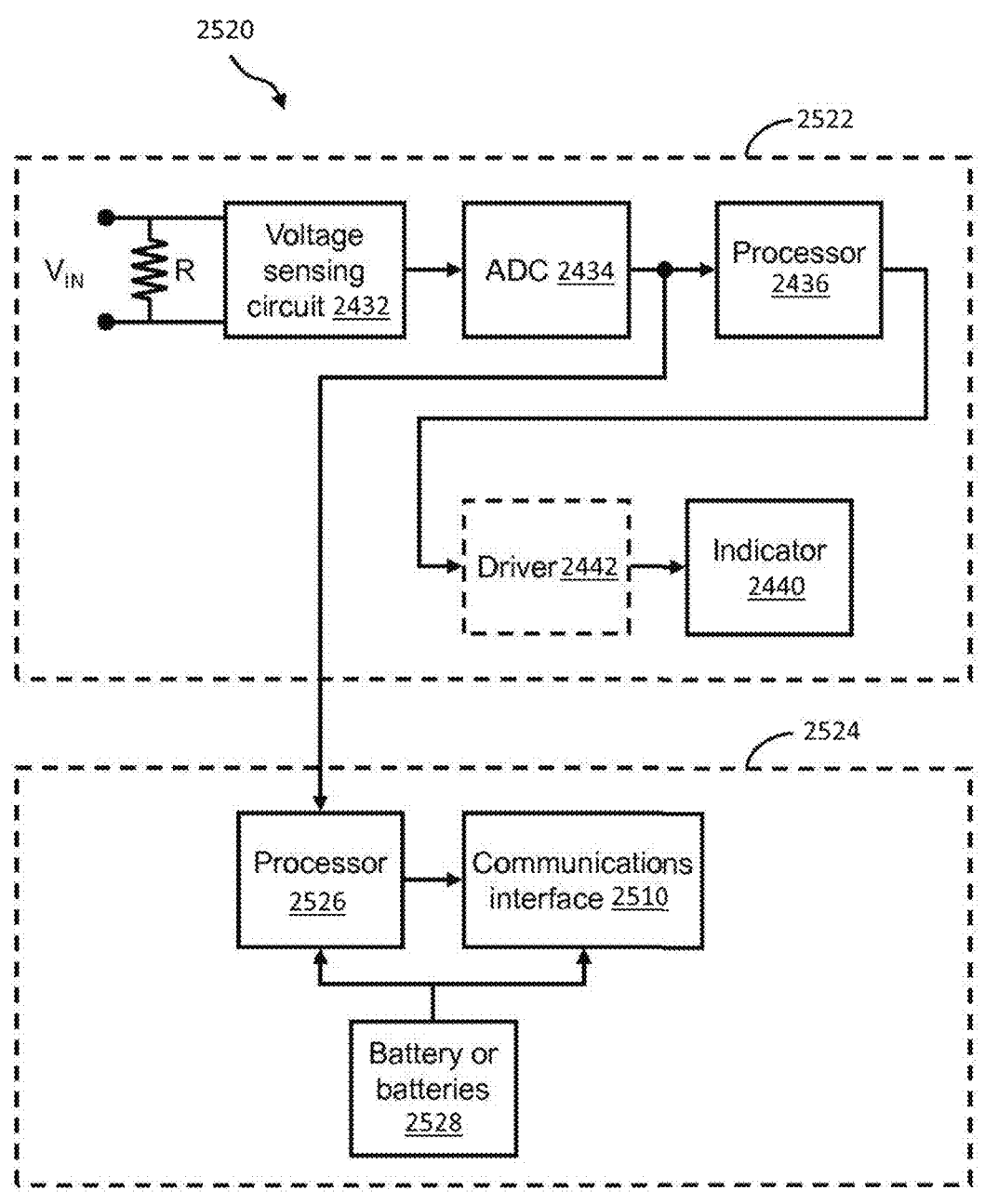
FIG. 4B illustrates a block diagram of an example of control electronics of the portable power case that is capable of communicating with the SOC mobile application.

FIG. 4B illustrates a block diagram of an example of SOC system 2520 of the portable power case that is capable of communicating with the SOC mobile application 2512. In this example, the SOC system 2520 includes an SOC portion 2522 and a communications portion 2524. The SOC portion 2522 is substantially the same as the control electronics 2430 shown in FIG. 3. The communications portion 2524 handles the communication of the SOC information to the SOC mobile application 2512 at, for example, the mobile phone 2130 and/or the tablet 2132.

The communications portion 2524 includes a processor 2526 that is communicatively connected to the communications interface 2510. The digital output of the ADC 2434 of the SOC portion 2522, which is the SOC information, feeds an input to the processor 2526. The processor 2526 can be any controller, microcontroller, or microprocessor that is capable of processing program instructions. One or more batteries 2528 provide power to the processor 2526 and the communications interface 2510. The one or more batteries 2528 can be any standard cylindrical battery, such as quadruple-A, triple-A, or double-A, or a battery from the family of button cell and coin cell batteries. A specific example of a battery 2528 is the CR2032 coin cell 3-volt battery.

In SOC system 2520, the SOC portion 2522 and the communications portion 2524 operate substantially independent of one another. Namely, the communications portion 2524 is powered separately from the SOC portion 2522 so that the communications portion 2524 is not dependent on the presence of the input voltage $V_{IN}$ at the SOC portion 2522 for power. Therefore, in this example, the communications portion 2524 is operable to transmit information to the SOC mobile application 2512 at any time. However, in order to conserve battery life, in one embodiment the processor 2526 is programmed to be in sleep mode when no voltage is detected at the input voltage $V_{IN}$ at the SOC portion 2522 and to wake up when an input voltage $V_{IN}$ is detected. Alternatively, the processor 2526 is programmed to periodically measure the SOC and send SOC information to the SOC mobile application 2512 on the at least one remote device periodically, such as every hour, regardless of the state of input voltage $V_{IN}$.

Figure 4C:
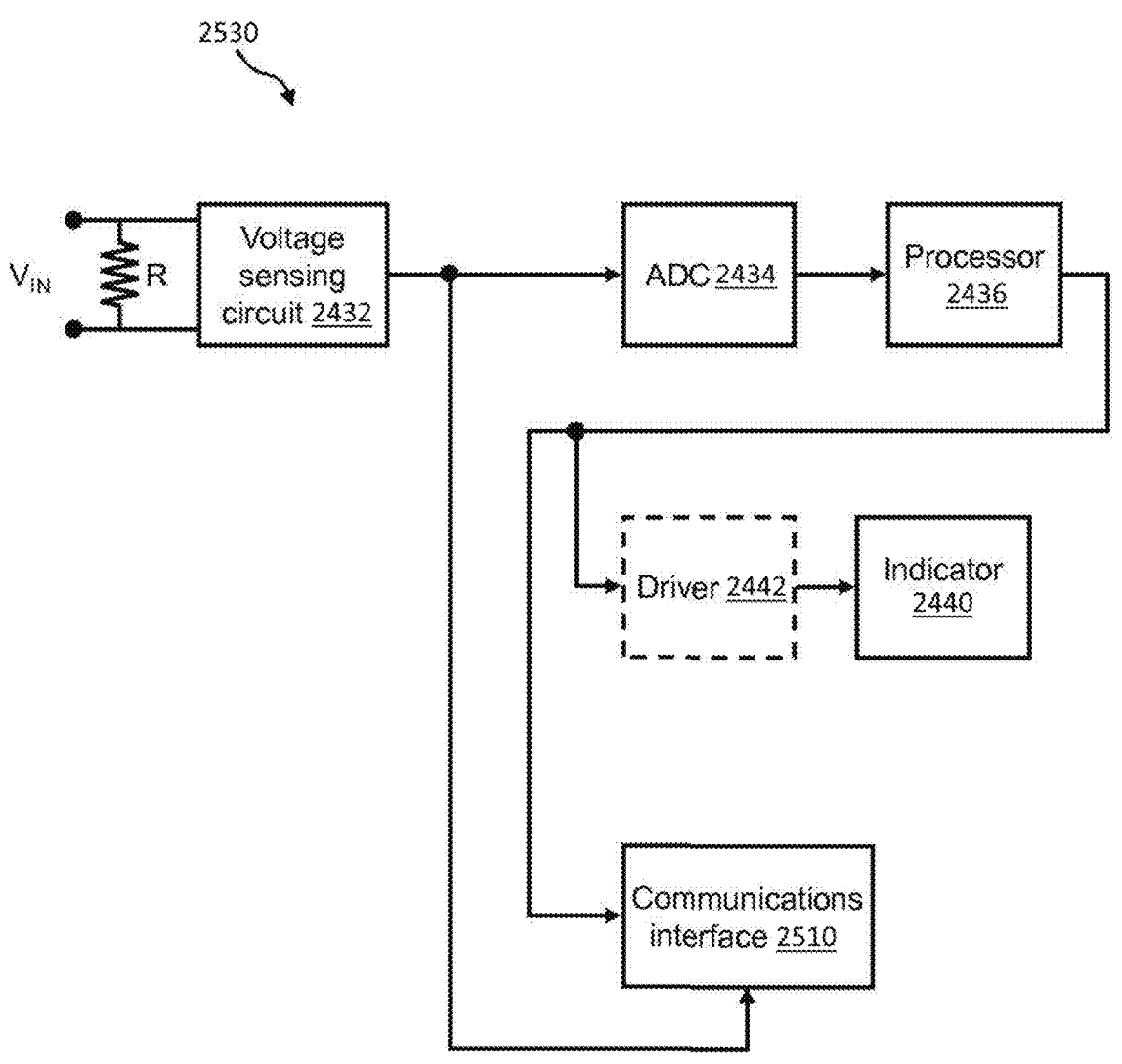
FIG. 4C illustrates a block diagram of another example of control electronics of the portable power case that is capable of communicating with the SOC mobile application.

FIG. 4C illustrates a block diagram of another example of control electronics 2530 of the portable power case that is capable of communicating with the SOC mobile application 2512. In this example, the operation of the communications interface 2510 is dependent on the presence of a voltage at input voltage $V_{IN}$. This is because, in control electronics 2530, the communications interface 2510 is powered from the output of voltage sensing circuit 2432. Further, the processor 2436 provides the input (i.e., the SOC information) to the communications interface 2510. A drawback of the control electronics 2530 of FIG. 4C as compared with the SOC system 2520 of FIG. 4B, is that it is operable to transmit SOC information to the SOC mobile application 2512 only when the portable power case has a charge.

In one embodiment, the portable power case includes a kill switch to deactivate the portable power case. For example, if a team of soldiers came under attack, the kill switch could be activated to render the portable power case, the transceiver, and/or any remaining batteries in the portable power case inoperable. A kill switch could also be used to render the portable power case inoperable at a designated expiration date for safety purposes.

In another embodiment, the PCB includes a global positioning system (GPS) chip. The GPS chip allows the portable power case to be located from a remote location. In one example, the GPS chip allows a search and rescue team to locate hikers or campers lost in the woods. The GPS chip also allows for the remote activation of a kill switch from anywhere in the world. For example, if the team of soldiers came under attack, command could then remotely activate the kill switch to render the portable power case, the transceiver, and/or any remaining batteries inoperable.

The portable power case is enclosed in a hard case (e.g., Pelican® 1060) in a preferred embodiment. The hard case is formed of polycarbonate in one embodiment. In one embodiment, the interior of the hard case has dimensions of 21×10.8×5.7 cm (8.25×4.25×2.25 in). In another embodiment, the exterior of the hard case has dimensions of 25.1.×14.2×6.7 cm (9.88×5.59×2.63 in). In yet another embodiment, the hard case is waterproof to 1 m, 4 m, or 30.5 m (100 ft). In still another embodiment, the hard case is welded (e.g., laser welded) shut or permanently closed to provide additional protection from environmental elements (e.g., dust, wind, water).

Figure 5A:
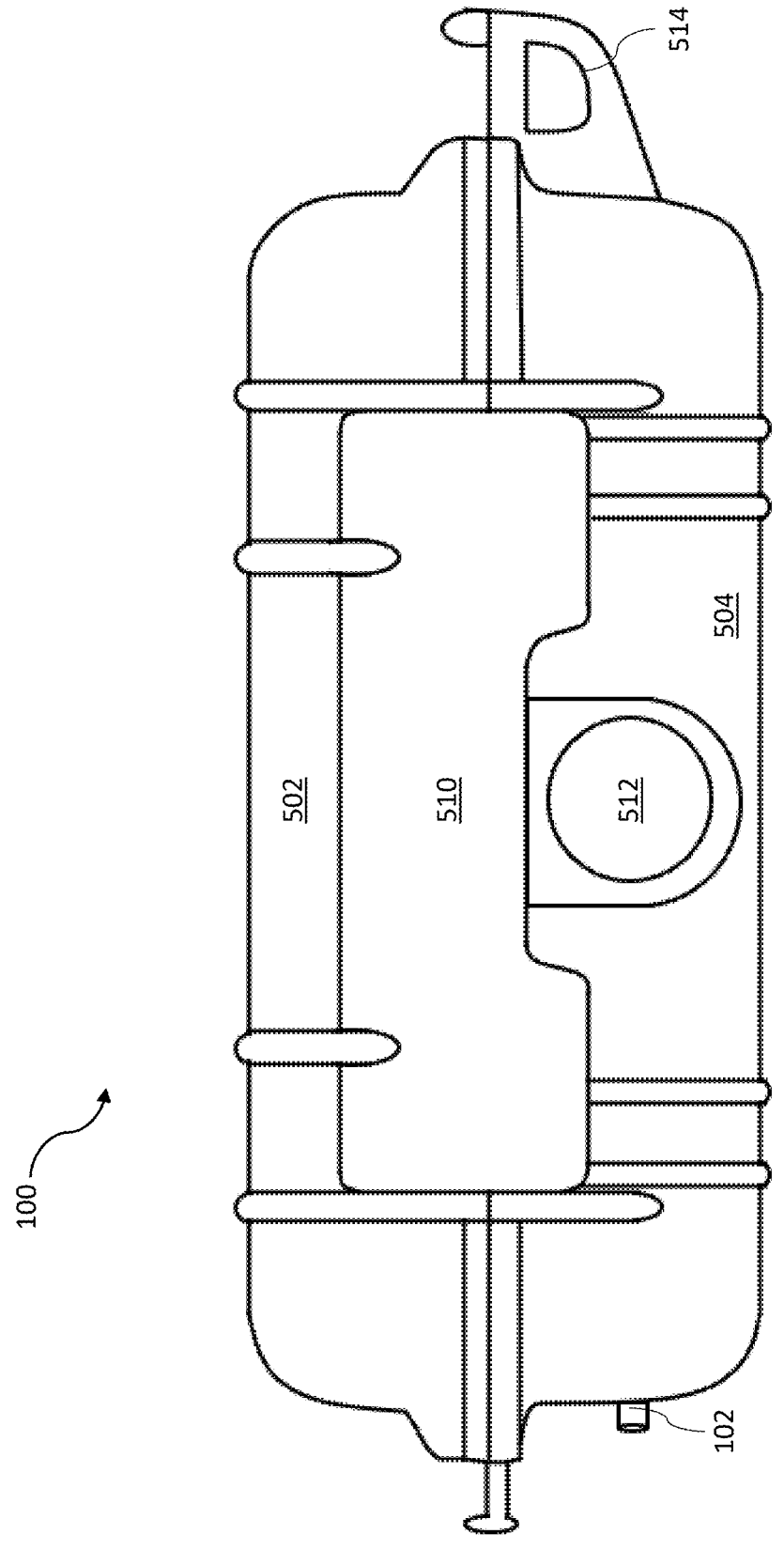
FIG. 5A illustrates a view of the exterior of one embodiment of the portable power case.

FIG. 5A illustrates a view of the exterior of one embodiment of the portable power case. The case includes a top portion 502 (e.g., a lid) and a bottom portion 504 (e.g., a base). The top portion 502 and the bottom portion 504 form a housing having an interior surface, an exterior surface, and an open interior space. The case includes a latch 510 for securing the contents of the case, a pressure purge valve 512, and a carabiner 514. In one embodiment, the latch includes a self-fusing silicone tape (e.g., Rescue Tape™) to prevent the latch from rattling, which could give away a soldier's position and/or distract the soldier. In another embodiment, the case is permanently or temporarily sealed using an adhesive and/or at least one zip tie.

In a preferred embodiment, the at least one battery and the BMS and/or the at least one PCB are disposed within the open interior space of the bottom portion 504 of the portable power case. In an alternative embodiment, one or more of the at least one PCB are disposed within the open interior space of the top portion 502 of the portable power case.

The portable power case has mounting attachments (e.g., single stud fittings or double stud fittings) compatible with L-track tie down systems in one embodiment. L-track tie down systems are often installed in military vehicles and aircraft. Additionally or alternatively, the portable power case has mounting attachments compatible with A-track, E-track, F-track, and/or kaptive beam tie down systems. In a preferred embodiment, the mounting attachments are attached to the bottom portion 504 of the portable power case.

Figure 5B:
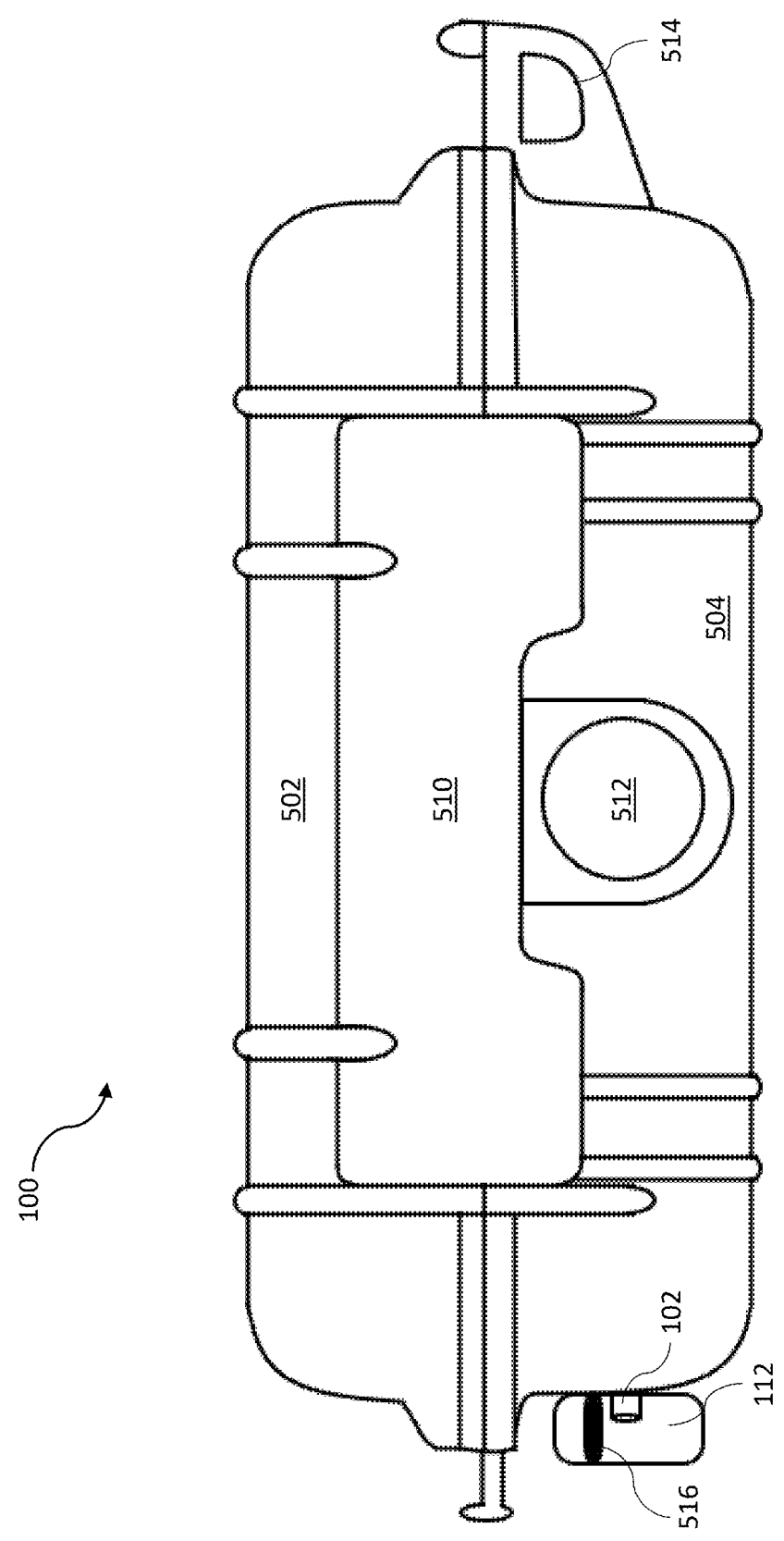
FIG. 5B illustrates a view of the exterior of another embodiment of the portable power case.

FIG. 5B illustrates another view of the exterior of one embodiment of the portable power case. In the embodiment shown in FIG. 5B, a transceiver 112 is attached to the exterior of the portable power case 100 with hook and loop tape 516. Alternatively, the transceiver 112 is attached to the portable power case with a cable tie or an adhesive. The transceiver is preferably removably attached to the portable power case to allow for replacement of the transceiver in the event of malfunction. Although the transceiver 112 is shown on the left side of the portable power case in FIG. 5B, it is equally possible for the transceiver to be located on any of the six sides of the portable power case. Additionally, it is equally possible for the transceiver to be located in the top portion or the bottom portion of the portable power case. Alternatively, the transceiver is housed within the interior of the portable power case with the transceiver's antenna mounted on the exterior of the case. In one embodiment, the hard case includes at least one pass through and/or threaded receptacle to position the transceiver's antenna outside of the hard case. Advantageously, this allows the body of the transceiver to be shielded from external elements, while allowing the antenna to communicate with the network. In another embodiment, the hard case includes at least one gasket to prevent environmental elements (e.g., water, dust) from entering the at least one pass through and/or the threaded receptacle.

In one embodiment, the portable power case includes at least one mounting bracket to attach the transceiver and/or the transceiver's antenna to the portable power case. In one embodiment, the at least one mounting bracket is positioned on an exterior surface of the case. Alternatively, the at least one mounting bracket is positioned on an interior surface of the case.

In another embodiment, the portable power case includes at least one USB port. It is equally possible for one or more of the at least one USB port to be located on any of the six sides of the portable power case. Additionally, it is equally possible for one or more of the at least one USB port to be located in the top portion or the bottom portion of the portable power case. In one example, a first USB port is located on the left side of the case in the bottom portion and a second USB port is located on the top side of the case in the top portion. In a preferred embodiment, the at least one USB port includes a cap to protect the at least one USB port.

In one example, the portable power case is formed from a Pelican® 1060 case. The Pelican® 1060 case includes a case liner that decreases the internal dimensions of the case. The case liner was removed from the case and the bottom of the case liner (i.e., the tray) was removed, leaving only a gasket that friction fits around a rim of the bottom of the case. Advantageously, this allows the case to form a waterproof seal while maximizing the internal dimensions of the case.

In one embodiment, the case is lined with a material that is resistant to heat and/or electromagnetic interference. An example of a material that is resistant to heat and/or electromagnetic interference is disclosed in U.S. application Ser. No. 16/191,058 and U.S. Patent Publications Nos. 20180102656, 20180062197, 20170229692, and 20160112004, each of which is incorporated herein by reference in its entirety. Advantageously, the material that is resistant to heat prevents and/or minimizes overheating of the at least one battery due to heat from a vehicle, a fire, and/or direct sunlight.

Figure 6:
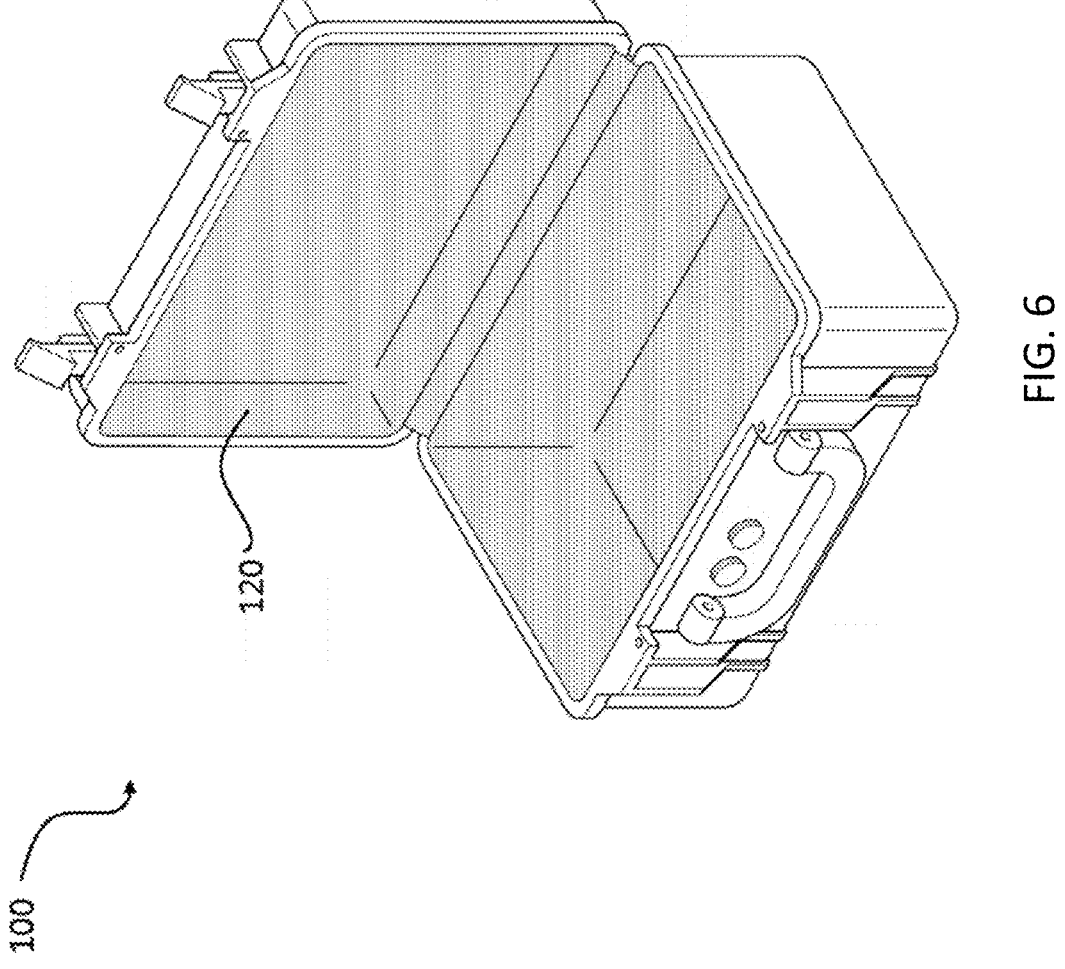
FIG. 6 illustrates one example of a portable power case lined with material resistant to heat.

FIG. 6 shows one example of the portable power case 100 lined with material resistant to heat and/or electromagnetic interference 120. The heat resistant material prevents heat transfer from electronic devices (e.g., transceiver). If a lithium ion battery overheats, it reduces performance of the battery, reduces the life span of the battery, and may result in a fire. Further, the batteries within the portable power case generate heat. Lining the portable power case with a material resistant to heat decreases the heat profile of soldiers, making them less vulnerable to enemy thermal imaging technology. In one embodiment, the transceiver is housed in the portable power case and at least one layer of the material resistant to heat is positioned between the transceiver and the at least one battery to prevent heat transfer.

Additionally, the heat resistant material may also be anti-electromagnetic interference material. The anti-electromagnetic interference material lining creates a Faraday cage and prevents disruption by electromagnetic radiation. In one embodiment, the antenna of the transceiver is positioned on an exterior surface of the case. Alternatively, the antenna of the transceiver is positioned inside the case between an interior surface of the case and the anti-electromagnetic interference material. Advantageously, this protects the antenna of the transceiver from environmental elements (e.g., dust, wind, water). In an alternative embodiment, the case may be coated with an electromagnetic interference and/or radio frequency interference shielding paint including copper, silver, nickel, and/or graphite. In this embodiment, the antenna of the transceiver is positioned on an exterior surface of the case.

The portable power case preferably has at least two access ports, at least two leads, or at least one access port and at least one lead accessibly positioned on the exterior surface of the hard case. The at least two access ports, at least two leads, or the at least one access port and the at least one lead are operable to charge the portable power case and supply power to electronic devices. In a preferred embodiment, the portable power case has two access ports or two leads. Each access port or lead can be used for both the charging function and the power supply function. The access ports or leads are not dedicated to the charging function only or the power supply function only. The access ports or leads can be used for either function at any time. For example, if the portable power case has two access ports, both access ports can be used for the charging the portable power case, one access port can be used for charging the portable power case and one access port can be used to supply power to an electronic device, or both access ports can be used for charging the portable power case. Advantageously, using both access ports to charge the portable power case shortens the charge time.

Each access port and/or lead is preferably operable to charge and discharge at the same time. In one example, a Y-splitter with a first connector and a second connector is attached to a lead. The Y-splitter allows the lead to supply power to equipment via the first connector and charge a battery via the second connector at the same time. In another example, a Y-splitter with a first connector and a second connector is attached to an access port. The Y-splitter allows the access port to supply power to equipment via the first connector and charge a battery via the second connector at the same time. Thus, each access port and/or lead is operable to allow power to flow in and out of the portable power case simultaneously.

In one embodiment, the at least two access ports, the at least two leads, or the at least one access port and the at least one lead prioritize the charging of electronic devices. In one example, the portable power case has two access ports. The second access port will stop charging an electronic device when the available power in the portable power case is lower than a designated threshold. In one embodiment, the portable power case sends a notification and/or an alarm to the at least one remote device (e.g., when the second access port stops charging because the available power is below the designated threshold).

The portable power case can supply power to electronic devices that are different for each access port or lead. In one example, the portable power case is charged by a solar panel and supplying power to a transceiver.

In one embodiment, the portable power case prioritizes at least one device by using at least one smart cable. The at least one smart cable stores information including, but not limited to, a unique identifier (e.g., MAC address) for the at least one device, power requirements of the at least one device, a type of device for the at least one device, and/or a priority ranking for the at least one device.

Additionally, the method used to charge the portable power case can be different for each access port or lead. In one example, the portable power case is charging using a solar panel and an AC adapter.

In a preferred embodiment, the at least two access ports, at least two leads, or at least one access port and the at least one lead are the same type of connector (e.g., female Fischer® SOV 105 A087 connectors, Tajimi™ Electronics part number R04-P5f, Tajimi™ Electronics part number TR05 R5f) and provide the same output voltage. Alternatively, the at least two access ports, the at least two leads, or the at least one access port and the at least one lead are made of at least two different types of connectors and/or provide different output voltages. Preferably, the diameter and/or shape of the connector is different for different output voltages. In one example, an access port or lead has a higher output voltage (e.g., 29.4V) and larger diameter, while another access port or lead has a lower output voltage (e.g., 16.8V) and smaller diameter. This coordination of higher voltage with larger diameter and lower voltage with smaller diameter makes it intuitive for an operator to use the correct access port or lead for the correct device (e.g., amplifier, radio, wearable battery, vehicle battery, AC adapter, generator, solar panel, laser designator, drone battery). Advantageously, this coordination allows an operator to associate the correct access port or lead with the correct device in the dark. Thus, the access port or lead is an inherent voltage selector. Further, the operator can quickly connect devices without knowing an operating voltage, thereby maintaining situational awareness and eyes on combat. In another example, the portable power case is used in a municipal emergency situation (e.g., natural disaster) and an untrained operator can easily connect devices without knowing the operating voltage. This coordination of higher voltage with larger diameter and lower voltage with smaller diameter facilitates installation in a static location, disassembly, and reinstallation in a new location. Additionally, the portable power case is operable to be charged using at least two different voltages simultaneously (e.g., charging using 16.8 V in a first access port and 29.4 V in a second access port) and/or power at least two power consuming devices of differing voltages simultaneously (e.g., powering a 16.8 V power consuming device in a first access port and a 29.4 V power consuming device in a second access port).

In yet another embodiment, the portable power case includes at least one access port and at least one USB port. In still another embodiment, the portable power case includes at least one lead and at least one USB port.

Figures 7, 8:
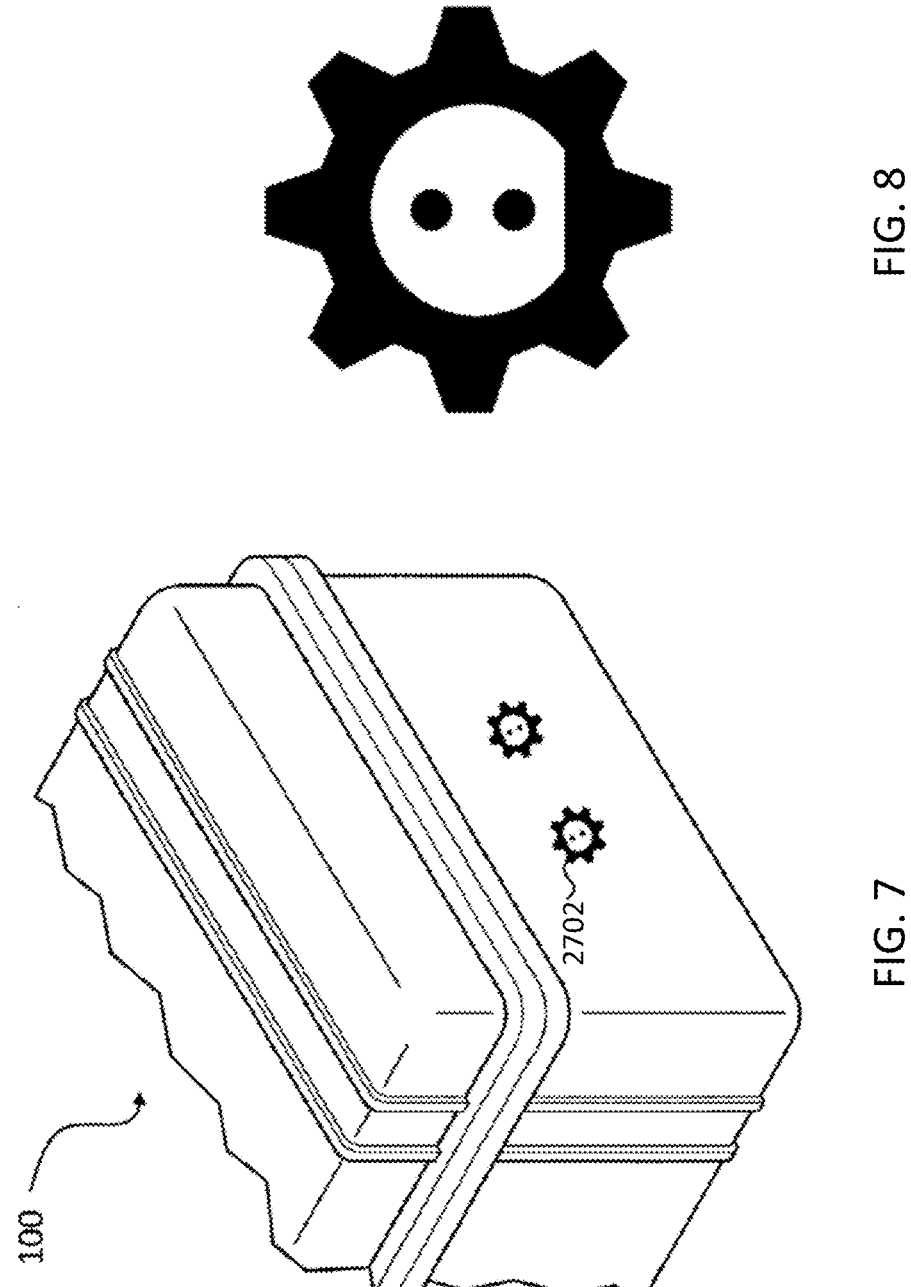
FIG. 7 illustrates one embodiment of the access ports of the portable power case.
FIG. 8 illustrates a keyway of the access ports of the portable power case.

FIG. 7 shows a view of one embodiment of the access ports. As shown in FIG. 8, the preferred embodiment includes a keyway (shown as a flat portion of the connector) to ensure correct orientation of cables. A gasket 2702 is provided around each of the access ports to seal the interior of the case from the external environment. In a preferred embodiment, the access ports are circular connectors (e.g., female Fischer® SOV 105 A087 connectors, Tajimi™ Electronics part number R04-P5f, Tajimi™ Electronics part number TR05 R5f). In one embodiment, a dust cap is provided for each of the access ports to protect the access port from environmental elements when not in use.

In an alternative embodiment, the portable power case includes at least one lead. A gasket is provided around each of the leads to seal the interior of the case from the external environment. In one embodiment, a dust cap is provided for each of the leads to protect the leads from environmental elements when not in use. In a preferred embodiment, the leads are flexible omnidirectional leads. Additional details regarding the leads are contained in U.S. application Ser. No. 16/191,058 and U.S. Publication Nos. 20180102656, 20180062197, and 20170229692, each of which is incorporated herein by reference in its entirety.

The portable power case is operable to be charged by a DC power source. In one embodiment, the DC power is a pedal power generator or a hand crank generator. In one embodiment, the portable power case is connected to the pedal power generator through a direct current-direct current (DC-DC) converter cable. The portable power case is also operable to be charged using energy generated from running water (e.g., water turbine, such as ESTREAM by ENAMOD or WATERLILY) and wind energy. In one embodiment, DC power source is a water turbine and/or a wind turbine. In one embodiment, the wind energy is generated using an unmanned aerial system or a drone on a tether. In an alternative embodiment, the wind energy is generated using a drive along turbine. In yet another embodiment, the wind energy is generated using a statically mounted turbine (e.g., ground mounted, tower mounted).

In one embodiment, the portable power case is charged using a water turbine. One example of a water turbine is disclosed in U.S. Pat. No. 9,784,236, which is incorporated herein by reference in its entirety. In another embodiment, the portable power case is waterproof to at least 4 m. In yet another embodiment, the antenna is enclosed within the portable power case. In still another embodiment, the case includes an automatic purge valve that is operable to equalize air pressure. Additionally or alternatively, the at least one access port is a panel mounted receptacle. In one embodiment, the portable power case and/or the water turbine is placed in running water (e.g., river, stream, creek, etc.) and/or underwater.

Solar Panel

The portable power case is operable to be charged using at least one solar panel. In a preferred embodiment, the at least one solar panel is a combination signal marker panel and solar panel, such as that disclosed in U.S. Publication Nos. 20170109978 and 20150200318, each of which is incorporated herein by reference in its entirety.

In a preferred embodiment, the at least one solar panel is formed of microsystem enabled photovoltaic (MEPV) material, such as that disclosed in U.S. Pat. Nos. 8,736,108, 9,029,681, 9,093,586, 9,143,053, 9,141,413, 9,496,448, 9,508,881, 9,531,322, 9,548,411, and 9,559,219 and U.S. Publication Nos. 20150114444 and 20150114451, each of which is incorporated herein by reference in its entirety.

In another preferred embodiment, the at least one solar panel is formed of SunPower™ Maxeon™ Gen III solar cells. In one embodiment, the solar cells are formed of monocrystalline silicon. The solar cells preferably have an antireflection coating. The solar cells have a tin-coated, copper metal grid backing. SunPower™ Maxeon™ Gen III solar cells are described in an article entitled "Generation III High Efficiency Lower Cost Technology: Transition to full scale Manufacturing" by authors Smith, et al., published in Photovoltaic Specialists Conference (PVSC), 2012 38$^{th}$ IEEE, doi: 10.11009/PVSC.2012.6317899, which is incorporated herein by reference in its entirety.

In a preferred embodiment, the solar panel does not include a maximum power point tracking (MPPT) charge controller. An MPPT charge controller is not necessary because the BMS of the at least one battery is operable to protect the at least one battery.

Figure 9:
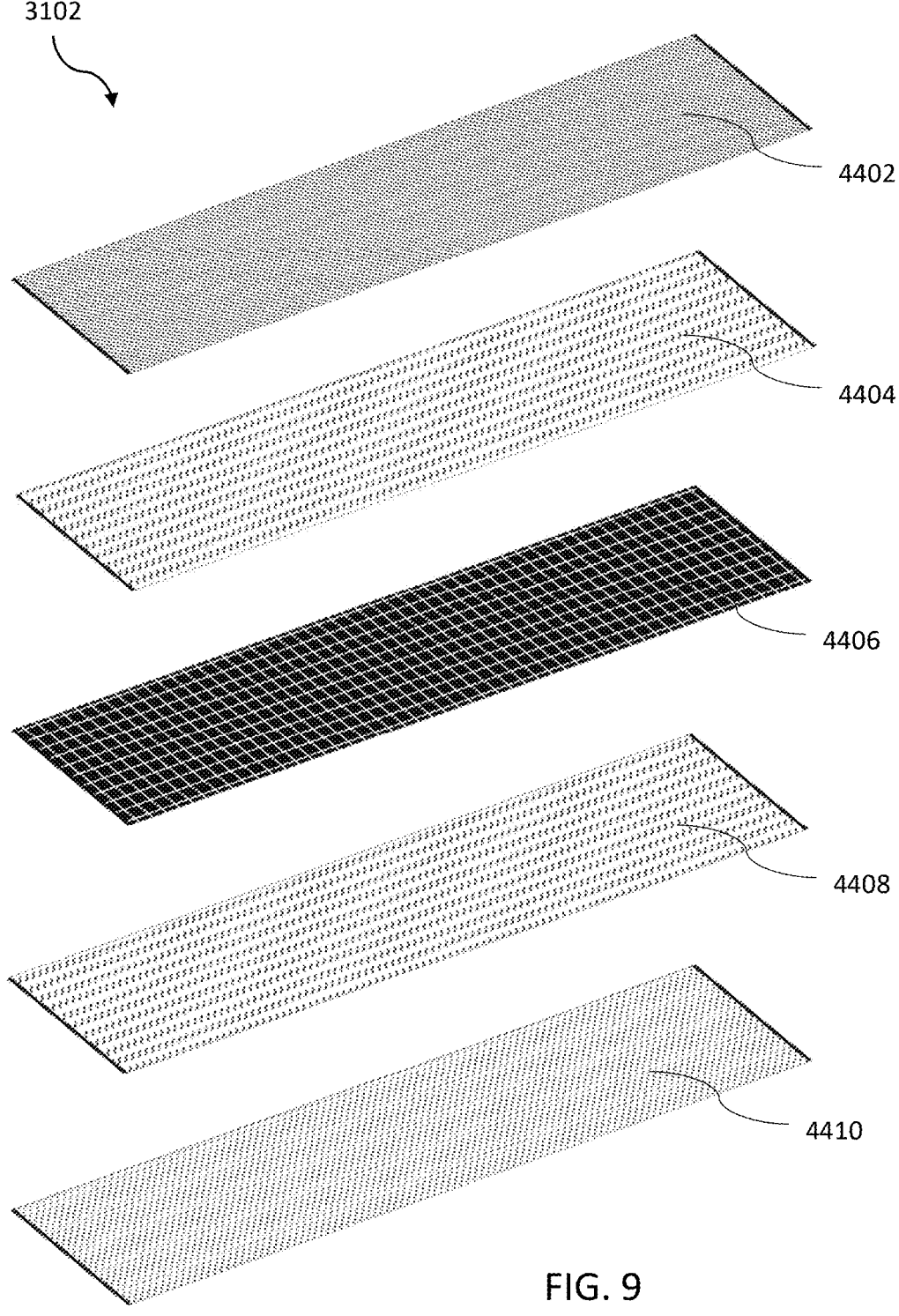
FIG. 9 illustrates another example of a solar module used with the solar panel.

FIG. 9 illustrates another example of a solar module 3102 used with the solar panel. The solar module 3102 includes a layer of ethylene tetrafluoroethylene (ETFE) 4402, a first layer of ethylene-vinyl acetate (EVA) 4404, a layer containing at least one solar cell 4406, a second layer of EVA 4408, and a layer of fiberglass 4410. In a preferred embodiment, the at least one solar module is less than about 0.04 inches thick. In a preferred embodiment, the at least one solar module weighs less than about 1 oz. In one embodiment, the at least one solar module has dimensions of about 4 inches by about 8 inches. The at least one solar module is preferably flexible. In one embodiment, the at least one solar module produces about 1 W of power. In one embodiment, the at least one solar module produces a voltage of about 6 V. In one embodiment, the at least one solar module produces a current of about 160 mA. Advantageously, the at least one solar module is operable to extend the life/run time of a rechargeable battery using this lower current (e.g., about 160 mA) in a constant-voltage phase while the battery is over 85% charged and the battery is in its state of highest internal resistance. This extends the life/run time of the rechargeable battery by a tangible amount of time, and provides a weight savings relative to the extended life/run time versus carrying additional batteries.

In yet another preferred embodiment, the solar panel is made of glass free, flexible thin film solar modules. The solar modules are formed of amorphous silicon with triple junction cell architecture. Alternatively, the solar modules are formed of multicrystalline silicon. These solar modules continue to deliver power when damaged or perforated. Additionally, these panels provide higher production and a higher output in overcast conditions than comparable glass panels. These panels also provide better performance at a non-ideal angle of incidence, advantageously allowing the solar modules to capture energy despite being worn or positioned suboptimally.

Figure 10:
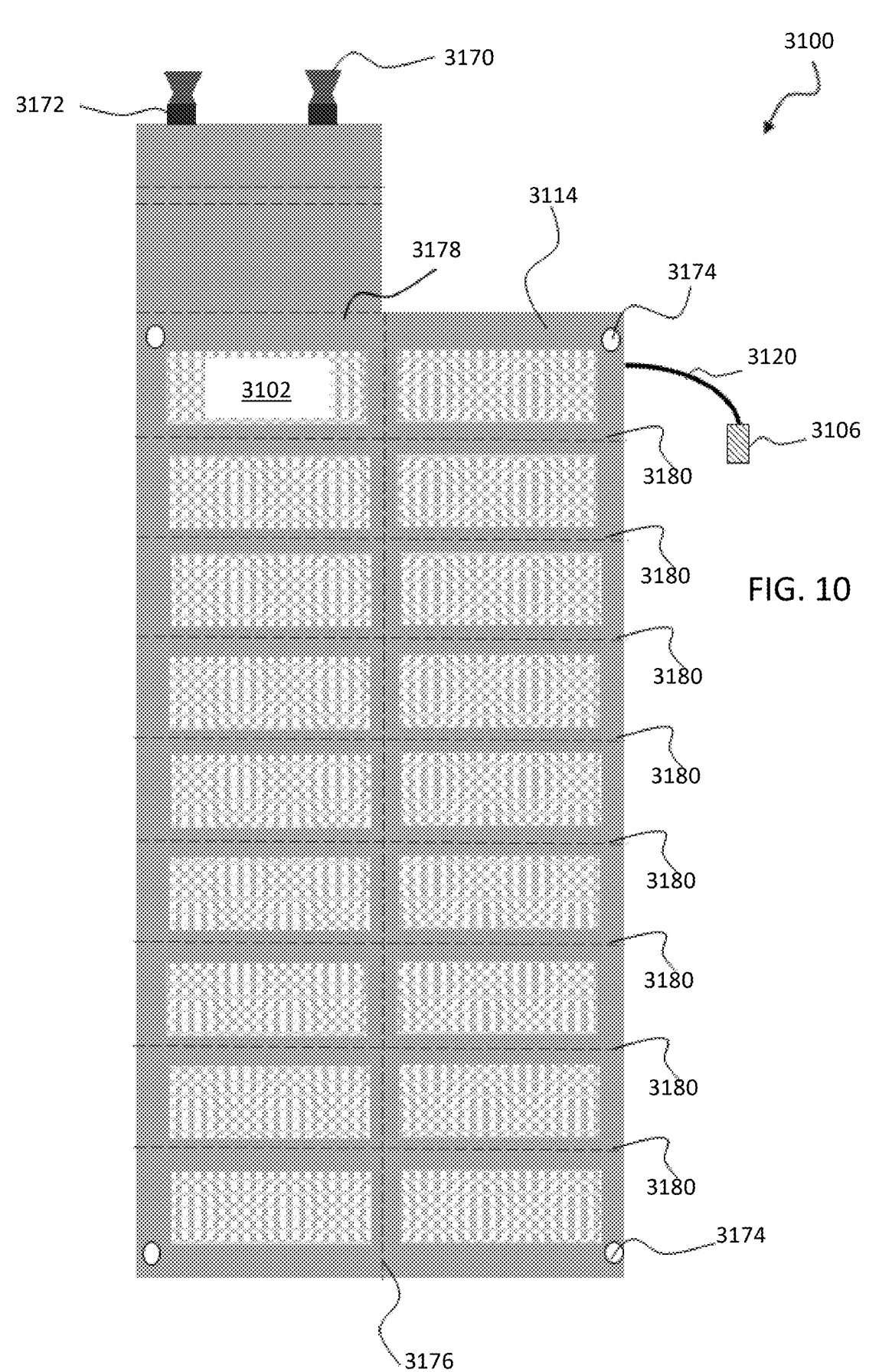
FIG. 10 illustrates a solar panel made with glass free, thin film solar modules.

FIG. 10 illustrates a solar panel 3100 made with glass free, thin film solar modules. The solar panel 3100 includes at least one solar module 3102 mounted on a substrate 3114. While FIG. 10 shows eighteen solar modules 3102 in the solar panel 3100, this is exemplary only. The solar panel 3100 can include any number of solar modules 3102 configured in series, configured in parallel, or configured in any combination of series and parallel arrangements. In particular, the configuration of solar modules 3102 in the solar panel 3100 can be tailored in any way to provide a certain output voltage and current. The output of any arrangement of solar modules 3102 in the solar panel 3100 is a direct current (DC) voltage. Accordingly, the solar panel 3100 includes at least one output connector 3106 that is electrically connected to the arrangement of solar modules 3102 via a cable or wire 3120. The at least one output connector 3106 is used for connecting any type of DC load to the solar panel 3100. In one embodiment, the cable or wire 3120 of the at least one output connector 3106 includes a blocking diode to prevent power from running back into the solar panel 3100. In a preferred embodiment, the at least one output connector 3106 is a circular connector (e.g., male Fischer® SOV 105 A087 connector, Fischer® LP360). In one example, the solar panel is used for supplying power to a device, such as a DC-powered radio. In another example, the solar panel is used for charging a battery. In yet another example, the solar panel is used for charging the battery of a portable battery pack and powers one or more devices simultaneously. In still another example, the solar panel is connected to a BUS and powering one or more devices simultaneously.

In one embodiment, the at least one connector includes one or more connectors that allow a first solar panel to connect to a second solar panel in series or in parallel. This allows a plurality of solar panels 3100 to be connected together in series, in parallel, or any combination of series and parallel arrangements. Advantageously, connecting a plurality of panels together allows the output current and/or output voltage to be raised.

The solar panel 3100 is preferably foldable. Prior art solar panels that are rollable require a tube to roll the solar panel. The solar panel 3100 of the present invention does not require a tube, which provides a weight and volume savings advantage over prior art. The weight and dimensions of the solar panel is important because it must be easily transported by a human. Soldiers often carry 60-100 lbs. of gear, including equipment (e.g., radios, solar panels, batteries) in their rucksack or attached to their vest. Additional weight slows soldiers down and also makes it more likely that they will suffer injuries to their body (e.g., injuries to the back, shoulders, hips, knees, ankles, and feet). Additional volume also impedes the movement of the soldiers.

The solar panel 3100 includes clips (female clip 3170 shown) to secure the solar panel 3100 when not in use in one embodiment. The female clip 3170 is attached to the solar panel 3100 via top webbing 3172. The solar panel 3100 includes eyelets 3174, which allows the solar panel to be secured to the ground or another surface. While FIG. 10 shows a total of four eyelets 3174 (one in each corner), this is exemplary only. The solar panel 3100 can include any number of eyelets 3174. The solar panel 3100 has a vertical fold axis 3176, a top horizontal fold axis 3178, and a plurality of horizontal fold axes 3180.

In one embodiment, the solar panel 3100 includes eighteen solar modules 3102 as shown in FIG. 10. In one embodiment, the solar modules are formed of amorphous silicon. The maximum power is about 118 W in one embodiment. The voltage at maximum power is about 28.8V in one embodiment. The current at maximum power is about 4.1 A in one embodiment. The dimensions of the solar panel 3100 are about 8 feet by about 3 feet when deployed in one embodiment. The weight of the solar panel 3100 is preferably less than about 10 pounds. The solar panel 3100 weighs about 9 pounds in one embodiment. The dimensions of the solar panel 3100 are about 10 inches by about 15 inches by about 2 inches when folded.

In a preferred embodiment, the solar panel includes 6 solar modules. In one embodiment, the solar modules are formed of multicrystalline silicon. The maximum power is 102 W in one embodiment. The voltage at maximum power is about 30.8V in one embodiment. The current at maximum power is about 3.3 A in one embodiment. The dimensions of the solar panel are about 3 feet by about 2.5 feet when deployed in one embodiment. The weight of the solar panel is preferably less than about 8 pounds. The solar panel weighs about 6.5 pounds in one embodiment. The dimensions of the solar panel are about 15 inches by about 12 inches by about 1 inch when folded.

Mesh Network

In one embodiment, the portable power case is operable to supply power to a mesh network. A mesh network is a local network topology wherein each node (e.g., bridges, switches) connect directly, dynamically, and non-hierarchically to as many other nodes as possible. Each node is operable to transmit its data and serve as a relay to deliver data to other nodes. Further, mesh networks can dynamically self-organize and self-configure, which simplifies installation. Additionally, the ability to self-configure allows the mesh network to dynamically distribute workloads in the event that one or more nodes experience failure. Examples of systems, devices, and methods for mesh networks are disclosed in U.S. Pat. Nos. 9,756,549, 9,992,021, and 10,015,720, U.S. Patent Publication No. 20180014241, and U.S. application Ser. No. 15/997,625, each of which is incorporated herein by reference in its entirety.

Figure 11A:
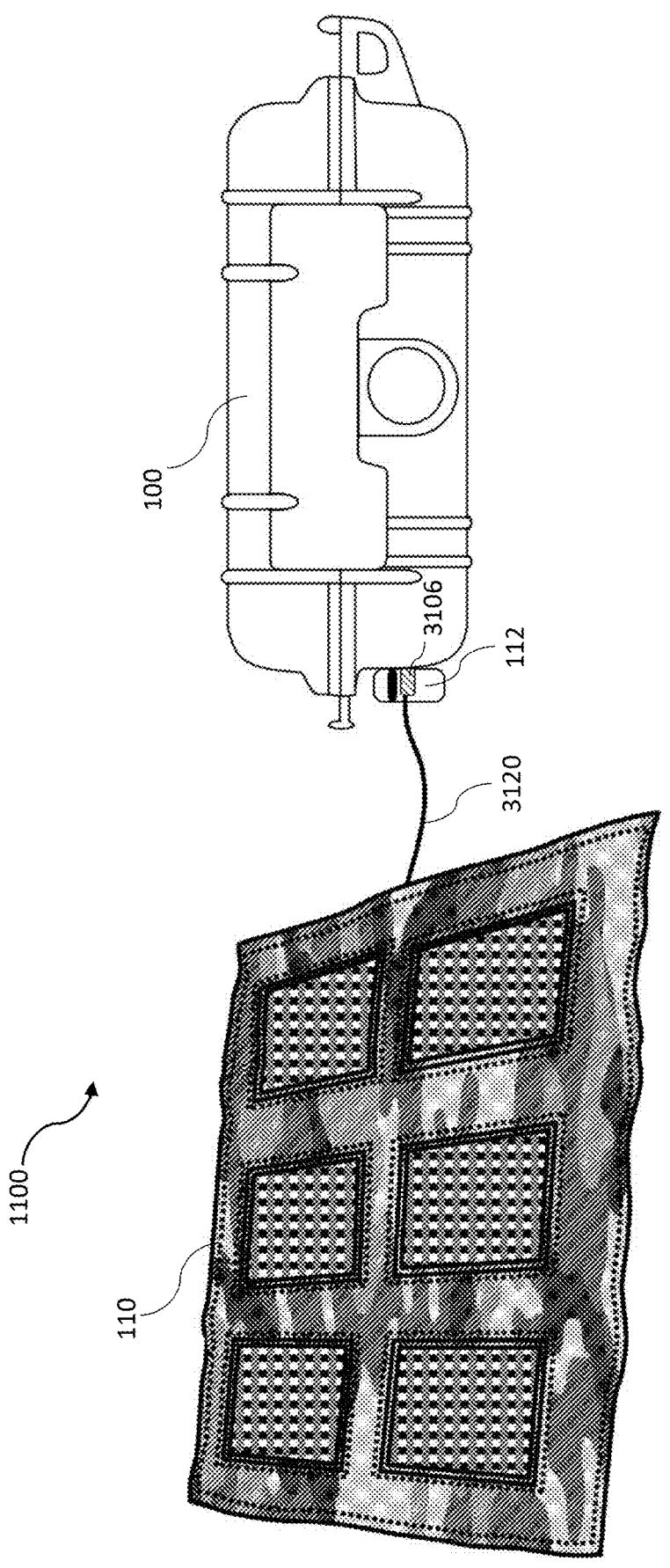
FIG. 11A illustrates one embodiment of a system to supply power to a mesh network including a portable power case, a solar panel, and a transceiver.

FIG. 11A illustrates one embodiment of a system 1100 to supply power to a mesh network including a portable power case, a solar panel, and a transceiver. The portable power case 100 provides power to the transceiver 112. The solar panel 110 is connected to an access port via a solar panel cable 3120 with a solar panel connector 3106. Advantageously, the solar panel 110 supplies energy to charge the at least one battery in the portable power case, thereby allowing the portable power case to supply power to the transceiver even when the sun is not shining (e.g., at night).

Figure 11B:
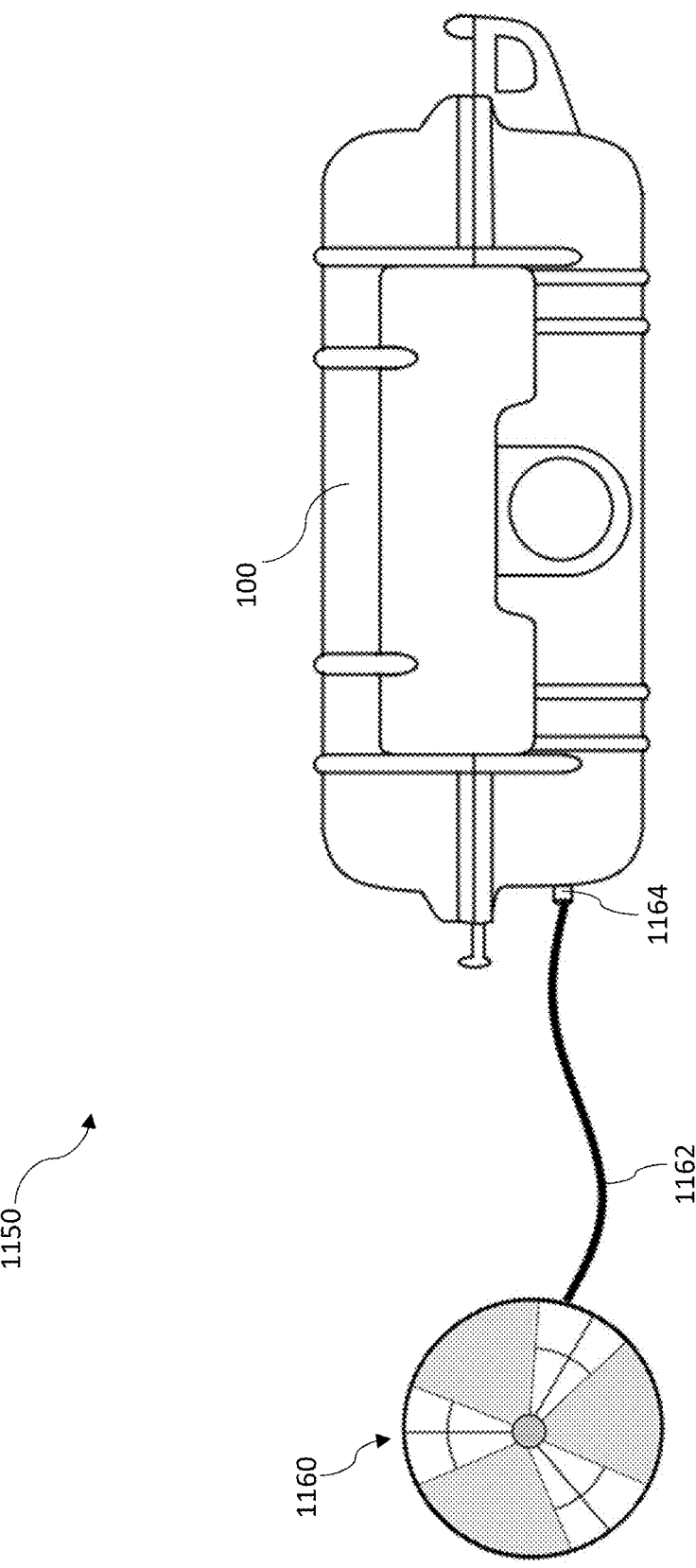
FIG. 11B illustrates one embodiment of a system to supply power to a mesh network including a portable power case and a water turbine.

FIG. 11B illustrates one embodiment of a system 1150 to supply power to a mesh network including a portable power case and a water turbine. The portable power case 100 provides power to the transceiver, which is preferably housed inside the case. The water turbine 1160 is connected to an access port via a water turbine cable 1162 with a water turbine connector 1164. Advantageously, the water turbine 1160 supplies energy to charge the at least one battery in the portable power case, thereby allowing the portable power case to supply power to the transceiver even when the sun is not shining (e.g., at night). Additionally, the water turbine 1160 has an additional advantage of not requiring light to supply energy to charge the at least one battery.

In a preferred embodiment, communications over the mesh network are encrypted. Advantageously, this allows for use of the mesh network for sensitive applications (e.g., military applications).

Figure 12:
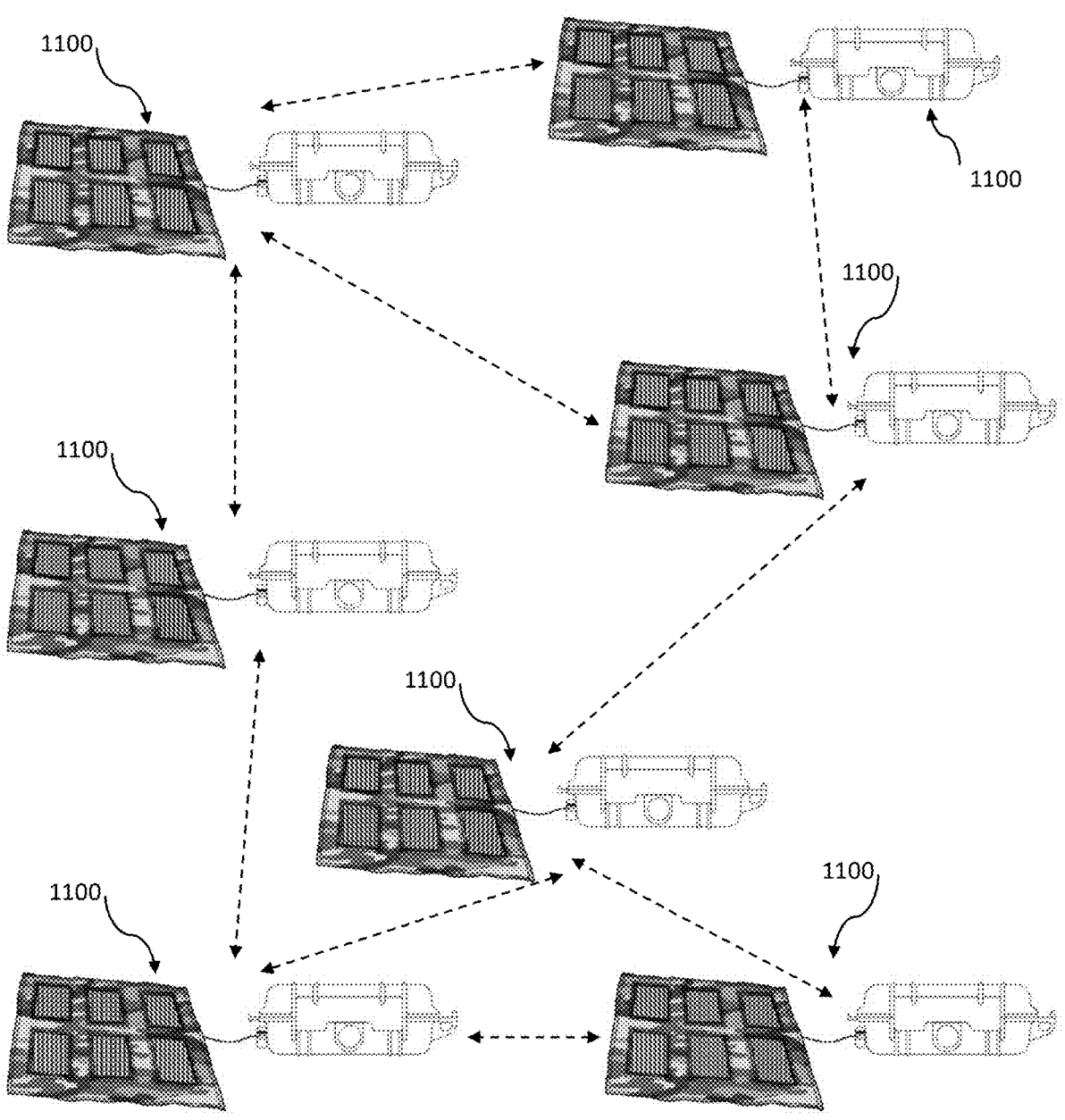
FIG. 12 illustrates one embodiment of a mesh network using a plurality of systems.

FIG. 12 illustrates one embodiment of a mesh network 1200 using a plurality of systems 1100. Each system 1100 is operable to communicate with at least one other system 1100 in the mesh network. Although each system shown includes a solar panel, it is equally possible for each system to include a different DC power source (e.g., water turbine, wind turbine). In one embodiment, the mesh network is formed using five systems including a solar panel (FIG. 11A) and three systems including a water turbine (FIG. 11B).

Technically, each system must be within a line of sight of the next system. The distance of the line of sight between systems is about 0 km to 5 km, with an average distance of 1 km. Generally, the higher an elevation of a system (e.g., pole, tree), the further the line of sight, which leads to a further possible operating distance.

The system can be installed on the ground, in trees, on poles, on a buoy or other flotation device (e.g., kayak), on a roof or other part of a building, on a boat, on a vehicle (e.g., tank), on a drone, and/or on a plane. In one embodiment, the system is powered by a DC power supply (e.g., solar modules, battery) on the drone and/or the plane.

The system is operable to be used in many diverse situations. In a first example, the system is used in a large controlled area (e.g., range) for training purposes (e.g., military, first responder). In a second example, the system is used on a buoy or on a kayak to provide communications for events (e.g., triathlons, fishing, group events). In a third example, the system is used in combat. In one embodiment, the combat usage includes installation on tank, a drone, and/or a plane. In a fourth example, the system is used to provide infrastructure for an area due a disaster (e.g., natural disaster, terrorist attack). In a fifth example, the system is used to provide communications for wildfire operations. In a sixth example, the system is used to provide communications in underwater and/or low visibility conditions (e.g., in a creek). In a seventh example, the system is used to provide communications in public parks, wildlife refuges, and/or hunting lands.

The above-mentioned examples are provided to serve the purpose of clarifying the aspects of the invention, and it will be apparent to one skilled in the art that they do not serve to limit the scope of the invention. The above-mentioned examples are just some of the many configurations that the mentioned components can take on. All modifications and improvements have been deleted herein for the sake of conciseness and readability but are properly within the scope of the present invention.

The invention claimed is:

1. A system for powering a mesh network, comprising:
a plurality of portable cases;
at least one global positioning system (GPS) chip; and
a plurality of transceivers;
wherein each of the plurality of portable cases is connected to at least one transceiver of the plurality of transceivers;
wherein the plurality of transceivers is operable to form the mesh network;
wherein at least one portable case of the plurality of portable cases includes a kill switch to deactivate the at least one portable case;
wherein the kill switch operates on geolocation data from the at least one GPS chip;
wherein the at least one portable case of the plurality of portable cases includes at least one lead; and
wherein the at least one lead includes a cable portion, wherein a spring is provided around the cable portion.

2. The system of claim 1, wherein the at least one portable case is waterproof or water resistant.

3. The system of claim 1, wherein an interior surface of the at least one portable case is lined with a material that is resistant to electromagnetic interference.

4. The system of claim 1, wherein each of the plurality of portable cases is connected to at least one power source of a plurality of power sources, wherein the at least one power source includes a solar panel, a wind turbine, and/or a water turbine.

5. The system of claim 1, wherein the at least one lead includes a connector portion, wherein the connector portion has an ingress protection (IP) rating of IPX6, IPX7, or IPX8.

6. The system of claim 1, wherein the at least one portable case includes an automatic purge valve that is operable to equalize air pressure.

7. The system of claim 1, wherein the at least one portable case includes a material that is resistant to heat.

8. The system of claim 1, wherein the cable portion and the spring are held in the at least one portable case such that a portion of the spring is positioned inside the at least one portable case and a portion of the spring is positioned outside the at least one portable case.

9. The system of claim 1, wherein the at least one portable case includes a pass through and/or a threaded receptacle to position an antenna of the at least one transceiver outside of the at least one portable case.

10. The system of claim 1, wherein each of the plurality of portable cases is within a line of sight of at least one other portable case of the plurality of portable cases.

11. The system of claim 10, wherein the line of sight is a distance between about 0 km and about 5 km.

12. The system of claim 1, wherein the system is installed in a tree, on a pole, on a buoy or other flotation device, on a roof or other part of a building, on a boat, on a vehicle, on a drone, and/or on a plane.

13. The system of claim 1, wherein one or more of the plurality of portable cases is installed in running water or underwater.

14. A system for powering a mesh network, comprising:
a plurality of portable cases;
at least one global positioning system (GPS) chip;
a plurality of power sources; and
a plurality of transceivers;

wherein at least one portable case of the plurality of portable cases is connected to at least one power source of the plurality of power sources;

wherein the at least one portable case is connected to at least one transceiver of the plurality of transceivers;

wherein the plurality of transceivers is operable to form the mesh network;

wherein the at least one portable case of the plurality of portable cases includes a kill switch to deactivate the at least one portable case;

wherein the kill switch operates based on geolocation data from the at least one GPS chip; and wherein the at least one portable case of the plurality of portable cases includes at least one lead.

15. The system of claim 14, wherein the at least one lead includes a connector portion, wherein the connector portion has an ingress protection (IP) rating of IPX6, IPX7, or IPX8.

16. A system for powering a mesh network, comprising:
a plurality of portable cases;
at least one geolocation chip; and
a plurality of transceivers;
wherein at least one portable case of the plurality of portable cases is connected to at least one transceiver of the plurality of transceivers;
wherein the plurality of transceivers is operable to form the mesh network;

wherein the at least one portable case includes control electronics configured to determine a state of charge of at least one battery;

wherein the at least one portable case of the plurality of portable cases includes a kill switch to deactivate the at least one portable case; and wherein the kill switch operates based on geolocation data from the at least one geolocation chip.

17. The system of claim 16, wherein an exterior surface of the at least one portable case includes at least one indicator for indicating the state of charge, and wherein the at least one indicator is at least one light-emitting diode (LED) and/or at least one liquid crystal display (LCD).

18. The system of claim 16, wherein the control electronics include a communications interface configured to communicate information related to the state of charge to a network.

19. The system of claim 18, wherein the communications interface is coupled to the network through a wired interface or a wireless interface.

20. The system of claim 16, wherein the control electronics include at least one processor, and wherein one or more of the at least one processor is programmed to periodically measure the state of charge and send state of charge information to at least one remote device.

* * * * *